(12) United States Patent
Stabile

(10) Patent No.: US 9,920,418 B1
(45) Date of Patent: Mar. 20, 2018

(54) PHYSICAL VAPOR DEPOSITION APPARATUS HAVING A TAPERED CHAMBER

(71) Applicant: James Stabile, Merrimac, MA (US)

(72) Inventor: James Stabile, Merrimac, MA (US)

( * ) Notice: Subject to any disclaimer, the term of this patent is extended or adjusted under 35 U.S.C. 154(b) by 0 days.

(21) Appl. No.: 14/192,162

(22) Filed: Feb. 27, 2014

Related U.S. Application Data

(63) Continuation-in-part of application No. 13/241,777, filed on Sep. 23, 2011, now abandoned.

(60) Provisional application No. 61/386,617, filed on Sep. 27, 2010.

(51) Int. Cl.
  *C23C 16/00* (2006.01)
  *C23C 14/22* (2006.01)

(52) U.S. Cl.
  CPC ................... *C23C 14/22* (2013.01)

(58) Field of Classification Search
  CPC .................................................. C23C 14/22
  USPC ......................................................... 118/719
  See application file for complete search history.

(56) References Cited

U.S. PATENT DOCUMENTS

| | | | |
|---|---|---|---|
| 3,575,133 A | 4/1971 | Van Audenhove et al. | |
| 3,874,525 A * | 4/1975 | Hassan | B23Q 7/1431 118/730 |
| 3,990,676 A * | 11/1976 | Brownstein | F16K 3/12 251/175 |
| 4,542,712 A * | 9/1985 | Sato | C30B 23/02 118/500 |
| 4,596,208 A | 6/1986 | Wolfson et al. | |
| 4,654,106 A | 3/1987 | Davis et al. | |
| 4,680,061 A | 7/1987 | Lamont, Jr. | |
| 5,322,567 A | 6/1994 | Deaton et al. | |
| 5,336,029 A * | 8/1994 | Kato | B65G 47/914 118/719 |
| 5,520,743 A * | 5/1996 | Takahashi | C23C 16/0236 118/730 |
| 5,534,068 A | 7/1996 | Beach et al. | |
| 5,549,435 A * | 8/1996 | Schertler | C23C 14/566 414/217 |
| 5,553,395 A | 9/1996 | Wen et al. | |
| 5,824,197 A | 10/1998 | Tanaka | |
| 5,935,397 A | 8/1999 | Masterson | |
| 5,964,949 A | 10/1999 | Savas | |
| 6,022,195 A | 2/2000 | Gaudet et al. | |
| 6,113,509 A | 9/2000 | Downing | |
| 6,217,715 B1 | 4/2001 | Sun et al. | |
| 6,270,582 B1 | 8/2001 | Rivkin et al. | |
| 6,506,312 B1 | 1/2003 | Bottomfield | |
| 6,559,065 B2 | 5/2003 | Kawashima | |
| 6,730,198 B2 | 5/2004 | Li et al. | |

(Continued)

*Primary Examiner* — Keath T Chen
(74) *Attorney, Agent, or Firm* — McCarter & English, LLP; David R. Burns

(57) ABSTRACT

A physical vapor deposition (PVD) apparatus having a deposition chamber and a source chamber of minimal volume, which can be selectively isolated from each other by a various load-lock valves. Exemplary embodiments can include a tapered high vacuum chamber disposed between the deposition chamber and the source chamber. The pump down time of the apparatus can be reduced, as compared to conventional PVD systems, due to the combined reduced volume of the chambers. Coating uniformity can also be improved by spinning each part to be coated on its' own axis while selectively exposing to a deposition source with minimal particle generation.

8 Claims, 24 Drawing Sheets

(56) References Cited

U.S. PATENT DOCUMENTS

| | | |
|---|---|---|
| 6,773,507 B2 | 8/2004 | Jallepally et al. |
| 6,858,254 B2 | 2/2005 | Conte et al. |
| 6,899,764 B2 | 5/2005 | Frijlink |
| 7,160,577 B2 | 1/2007 | Ahn et al. |
| RE40,192 E * | 4/2008 | Schertler .................. 269/21 |
| 7,364,772 B2 | 4/2008 | Long et al. |
| 7,410,668 B2 | 8/2008 | Ahn |
| 7,517,141 B2 | 4/2009 | Patel et al. |
| 7,541,061 B2 | 6/2009 | Ramsay |
| 7,670,646 B2 | 3/2010 | Ahn et al. |
| 2002/0031420 A1* | 3/2002 | Kroeker ............ H01L 21/67126 414/217 |
| 2002/0187265 A1* | 12/2002 | Mori .................... C23C 14/022 427/282 |
| 2005/0244580 A1 | 11/2005 | Cok et al. |
| 2005/0279637 A1 | 12/2005 | Pinter et al. |
| 2006/0054494 A1 | 3/2006 | Reiss |
| 2006/0081567 A1* | 4/2006 | Dougherty, Sr. ...... B23K 10/02 219/121.59 |
| 2006/0272577 A1 | 12/2006 | Mao et al. |
| 2007/0000444 A1 | 1/2007 | Shimizu |
| 2007/0048992 A1 | 3/2007 | Hosokawa et al. |
| 2007/0051312 A1 | 3/2007 | Sneh |
| 2007/0166133 A1 | 7/2007 | Lee et al. |
| 2008/0305267 A1* | 12/2008 | Gray et al. ......... B05B 13/0242 436/346 |
| 2010/0147681 A1 | 6/2010 | Li et al. |
| 2010/0272893 A1* | 10/2010 | Chang et al. ......... C23C 14/044 118/730 |
| 2011/0287170 A1* | 11/2011 | Colclough et al. ....... F04F 5/46 118/308 |

* cited by examiner

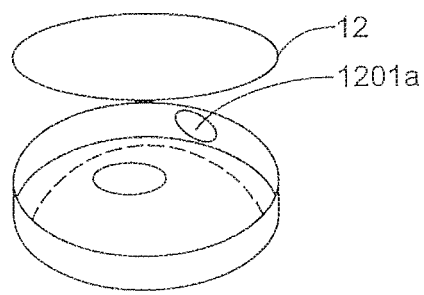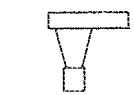
FIG. 19A     FIG. 20A
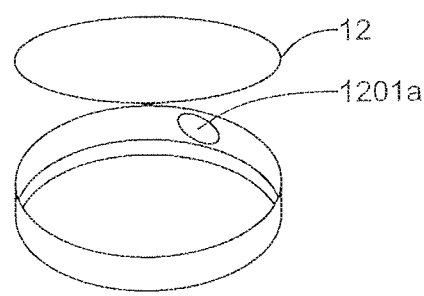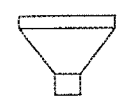
FIG. 19B     FIG. 20B
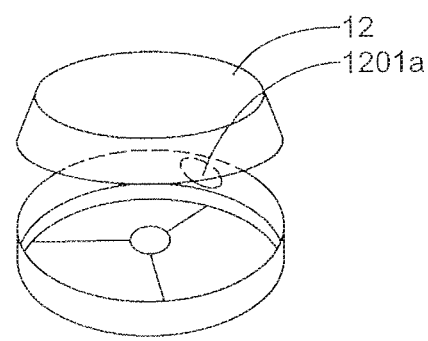
FIG. 19C     FIG. 20C
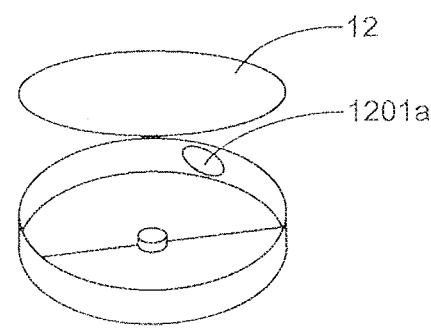
FIG. 19D     FIG. 20D

PHYSICAL VAPOR DEPOSITION APPARATUS HAVING A TAPERED CHAMBER

CROSS REFERENCE TO RELATED APPLICATIONS

This application is a continuation-in-part of U.S. patent application Ser. No. 13/241,777, filed Sep. 23, 2011, which claims priority to Provisional Application No. 61/386,617, filed Sep. 27, 2010, each application of which is incorporated herein by reference in its entirety.

FIELD OF THE INVENTION

Certain of the embodiments relate generally to a physical vapor deposition apparatus, and more particularly, to a physical vapor deposition apparatus having a Tapered Load-locked Chamber (TLC).

DESCRIPTION OF RELATED ART

Conventional physical vapor deposition (PVD) systems generally have chambers that include a cylindrical, rectangular, bell or D-shaped chamber as illustrated in FIGS. 1A, 1B, 1C and 1D, and they are typically large and costly. A space between an evaporation source, such as an electron beam gun, disposed at a bottom of the chamber, and parts to be coated, such as a semiconductor wafer, disposed towards the upper portion of the chamber is typically eighteen inches or more. This "dead space" generally ensures that the coating of the parts have good uniformity. A dead space of less than eighteen inches can adversely affect the uniformity of the coating material because the output of the electron beam gun can cause splattering of the coating material to be evaporated. Examples of prior art vapor deposition apparatus include the following:

U.S. Pat. No. 4,596,208 issued Jun. 24, 1986 discloses a chemical vapor deposition (CVD) Reaction Chamber comprising a vertical double-walled reaction tube having a tapered top provided with a concentric gas inlet and a bottom provided with a gas outlet. However, the primary reaction chamber is cylindrical. This patent discloses a CVD process which is a different process than PVD (physical vapor deposition). PVD requires vacuum levels typically 1000 times lower than CVD. PVD process times are drastically affected by pump down time, the time to reach 1×10 exp-6 Torr. The CVD processes do not require such a low vacuum level and the present invention is constructed specifically for performing a PVD process.

U.S. Pat. No. 5,534,068 issued Jul. 9, 1996 discloses a parylene deposition apparatus including a frusto-conical shaped deposition chamber which minimizes deposition chamber volume and maximizes flow of vapor over the surface of a wafer and a vacuum bypass assembly to quickly reduce pressure in the vacuum chamber. However, the chamber is intended for chemical vapor deposition (CVD) and not physical vapor deposition (PVD). This patent discloses a CVD process that is a different process than PVD (physical vapor deposition). PVD requires vacuum levels typically 1000 times lower than CVD. PVD process times are drastically affected by pump down time, the time to reach 1×10 exp-6 Torr. CVD processes do not require such a low vacuum level and the present invention is designed specifically for PVD. In most semiconductor applications, CVD is used to deposit dielectric materials. PVD is the preferred method to deposit metals. PVD processes typically rotate the parts being coated, unlike CVD process which keep the parts stationary.

U.S. Pat. No. 5,553,395 issued Sep. 10, 1996 discloses an improved bubbler for use with solid metal organic source material used in metal organic chemical vapor phase deposition (MOCVD) system. The bubbler comprises a sealed container comprising a slanted wall having an inverted cone-shaped cross-section. This patent discloses an apparatus for a CVD process which is different from the PVD (physical vapor deposition). PVD requires vacuum levels typically 1000 times lower than CVD as described above which are typically not designed to achieve such vacuum levels.

U.S. Pat. No. 5,322,567 discloses particulate reduction baffles 33 and 133 having the shape of a truncated conical section and including a wafer catching device 140 disposed in the upper portion of a sleeve 129, and a wafer deflection member 131 for a chemical vapor deposition apparatus. However, the truncated conical baffles 33 and 133 are positioned within a cylindrical reaction chamber. This patent discloses an apparatus designed specifically for a CVD process and not a PVD (physical vapor deposition) process.

U.S. Pat. No. 6,217,715 discloses a physical vapor deposition chamber coated with a metal or metal oxide to reduce pump down time and base pressure prior to high vacuum processing of a substrate such as a silicon wafer. However, the overall chamber size remains the same. The present invention teaches a load-lock deposition chamber followed by a tapered high vacuum chamber that achieves 1×10 exp-6 Torr in less time because of its shape, not a coating of the interior.

SUMMARY OF THE INVENTION

Accordingly, it is therefore an object of this invention to provide a physical vapor deposition (PVD) apparatus having a Tapered Load-Locked Chamber (TLC) requiring less time and energy costs to reach a vacuum level $1 \times 10^{-6}$ torr or lower than conventional PVD systems.

It is another object of this invention to provide three chambers from the top down comprising a load-lock deposition chamber, a high vacuum chamber, and a source chamber.

It is a further object of this invention to provide a dual axis spinning wafer planetary to hold products that are to be coated in the load-locked deposition chamber.

It is yet another object of this invention to provide a stackable planetary for processing greater quantities of wafers without increasing the footprint or energy consumption of the entire apparatus.

These and other objects are further accomplished by exemplary embodiments of a physical vapor deposition apparatus that includes a load-lock deposition chamber having a lid to enable loading or unloading components to be coated in the chamber, a load-lock valve attached to the bottom of the load-lock deposition chamber, and a tapered high vacuum chamber having an upper flange and a lower flange. The upper flange of the high vacuum chamber is operatively coupled to the load-lock valve and the lower flange of the high vacuum chamber is operatively coupled to a source chamber configured to house an evaporation source. Exemplary embodiments of the physical vapor deposition apparatus can include vacuum pumps operable to lower a pressure within the apparatus to a specified pressure level (e.g., lower a vacuum level of the apparatus to a predetermined level). The lid comprises a rotatable lid. The deposition chamber comprises a bore hole allowing coating materials to pass from the high vacuum chamber to the components in the deposition chamber. The plurality of vacuum pumps can include a turbo pump attached to the high vacuum chamber with a second vacuum pump attached to an outlet of the turbo pump. The plurality of vacuum pumps comprise a cryopump attached to a second load-lock valve, the second load-lock valve being attached to a side of the high vacuum chamber, and a rough pump is attached to the load-lock deposition chamber. The tapered high vacuum chamber comprises a tapered rectangular shaped chamber or the tapered high vacuum chamber comprises a tapered truncated cone shaped chamber. The high vacuum chamber comprises a sight glass attached to a side of the high vacuum chamber for viewing the evaporation source. The load-lock deposition chamber comprises a planetary for holding the components being coated. The planetary comprises means for rotating the components being coated. The planetary rotating means comprises a feedthrough shaft, means for rotating the planetary, and means passing around a plurality of wafer holders on the planetary for spinning the wafer holders on each wafer holder's axis. The evaporation source in the source chamber comprises one of a group consisting of an electron beam gun a thermal/filament source, a sputtering or ion gun, and a plasma electrode. The load-lock deposition chamber comprises a rotation feed-through for driving a planetary positioned within the deposition chamber. The load-lock valve deposition chamber comprises a plurality of valves and gauges for controlling operational conditions within the apparatus.

The objects are further accomplished by a method for making a physical vapor deposition apparatus comprising the steps of providing a load-lock deposition chamber having a lid to enable loading or unloading components to be coated in the chamber, attaching a load-lock valve to the bottom of the load-lock deposition chamber, providing a tapered high vacuum chamber having an upper flange and a lower flange, the upper flange attaching to the load-lock valve, and clamping a source chamber to the lower flange of the tapered high vacuum chamber, the source chamber comprising an evaporation source, providing means to allow the source chamber to rotate away from the apparatus for loading material to be evaporated, and attaching a plurality of vacuum pumps to the apparatus for lowering a vacuum level of the apparatus to a predetermined level. The step of providing a load-lock deposition chamber having a lid comprises the step of rotating the lid to load or unload the components. The step of attaching the plurality of vacuum pumps comprises the steps of attaching a turbo pump to the high vacuum chamber and attaching a second vacuum pump to an outlet of the turbo pump. The step of attaching the plurality of vacuum pumps comprises the steps of attaching a cryopump to a second load-lock valve, the second load-lock valve being attached to a side of the high vacuum chamber, and attaching a rough pump to the load-lock deposition chamber. The step of providing the tapered high vacuum chamber comprises the step of providing a tapered rectangular shaped chamber. Also, the step of providing the tapered high vacuum chamber comprises the step of providing a tapered truncated cone shaped chamber. The method wherein the step of providing a tapered high vacuum chamber comprises the step of providing a sight glass attached to a side of the tapered high vacuum chamber for viewing the evaporation source. The step of providing a load-lock deposition chamber comprises the step of providing in the load-lock deposition chamber a planetary for holding the components being coated. The step of providing a planetary for holding the components being coated comprises the step of rotating the components held within the planetary. The step of attaching the source chamber to the lower flange of the tapered high vacuum chamber comprises the step of providing for the evaporation source one of a group consisting of an electron beam gun, a thermal/filament source, a sputtering or ion gun and a plasma electrode. The step of providing the load-lock deposition chamber having a lid comprises the step of providing a rotation feed-through in the deposition chamber for driving a planetary positioned within the deposition chamber. The step of attaching a load-lock valve to the bottom of the load-lock deposition chamber comprises the step of providing on the deposition chamber a plurality of valves and gauges for controlling operational conditions within the apparatus.

Exemplary embodiments of the present disclosure further provide for physical vapor deposition apparatus having a high vacuum chamber, a deposition chamber, a valve, and a source chamber. The high vacuum chamber extends along a longitudinal axis from a first end and a second end and tapers inwardly along the longitudinal axis from the first end to the second end. The deposition chamber includes an interior receiving area configured to receive one or more components to be coated and is disposed proximate to the first end of the high vacuum chamber. The deposition chamber is positioned substantially centered over the first end of the tapered high vacuum chamber. The valve is disposed between the interior area of the deposition chamber and the first end of the high vacuum chamber to selectively separate the interior receiving area of the deposition chamber from the high vacuum chamber. The source chamber is disposed proximate to the second end of the high vacuum chamber and is configured to house an evaporation source.

Exemplary embodiments of the present disclosure further provide for a physical vapor deposition apparatus that includes a source chamber and a deposition chamber. The source chamber is configured to house an evaporation source. The deposition chamber is in selective fluidic communication with the source chamber and includes an interior receiving area configured to receive one or more components to be coated. A valve is configured to fluidically couple and decouple the interior receiving area and the source chamber.

Exemplary embodiments further provide for a method for depositing coating material on a wafer. The method includes closing a ring valve to fluidically isolate an upper portion of a deposition chamber of a physical vapor deposition apparatus from a source chamber of the physical vapor deposition apparatus, inserting the wafer in an upper portion of the deposition chamber, opening the ring valve to fluidically couple the upper portion of a deposition chamber with the source chamber, and evaporating an evaporation source comprising coating material within the source chamber.

Additional objects, features and advantages of the invention will become apparent to those skilled in the art upon consideration of the following detailed description taken in connection with the accompanying drawings of the preferred embodiment exemplifying the best mode of carrying out the invention as presently perceived.

BRIEF DESCRIPTION OF THE DRAWINGS

The appended claims particularly point out and distinctly claim the subject matter of this invention. The various objects, advantages and novel features of this invention will be more fully apparent from a reading of the following detailed description in conjunction with the accompanying drawings in which like reference numerals refer to like parts, and in which:

FIG. 19A depicts a perspective view of the deposition chamber offset relative to the vacuum chamber and having an offset bore hole according to exemplary embodiments of the present disclosure.

FIG. 19B depicts a perspective view of the deposition chamber centered relative to the vacuum chamber and having a larger central bore hole according to exemplary embodiments of the present disclosure.

FIG. 19C depicts a perspective view of the deposition chamber centered relative to the vacuum chamber and using a ring valve according to exemplary embodiments of the present disclosure.

FIG. 19D depicts a perspective view of the deposition chamber offset relative to the vacuum chamber and having a half disc valve according to exemplary embodiments of the present disclosure.

FIG. 20A depicts a side view of the deposition chamber of FIG. 19A with respect to a high vacuum chamber according to exemplary embodiments of the present disclosure.

FIG. 20B depicts a side view of the deposition chamber of FIG. 19B with respect to a high vacuum chamber according to exemplary embodiments of the present disclosure.

FIG. 20C depicts a side view of the deposition chamber of FIG. 19C with respect to a high vacuum chamber according to exemplary embodiments of the present disclosure.

FIG. 20D depicts a side view of the deposition chamber of FIG. 19D with respect to a high vacuum chamber according to exemplary embodiments of the present disclosure.

DETAILED DESCRIPTION OF EXEMPLARY EMBODIMENTS

Figure 1A:
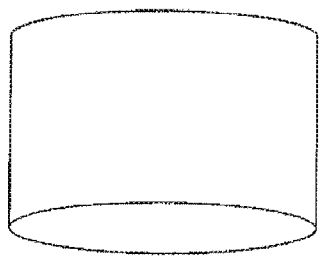
FIGS. 1A, 1B, 1C and 1D illustrate perspective views of various shapes of vacuum chambers in the prior art.
Figure 1B:
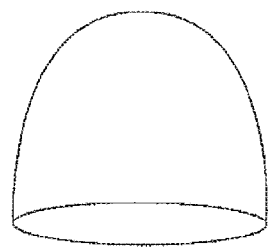
Figure 1C:
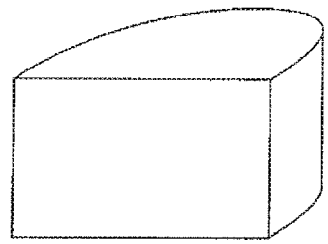
Figure 1D:
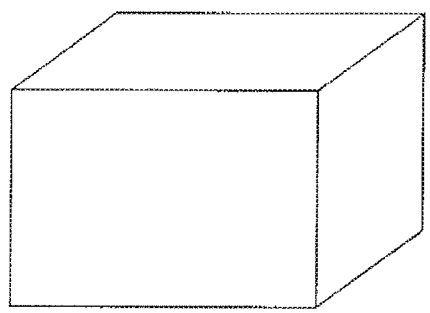
Figure 2:
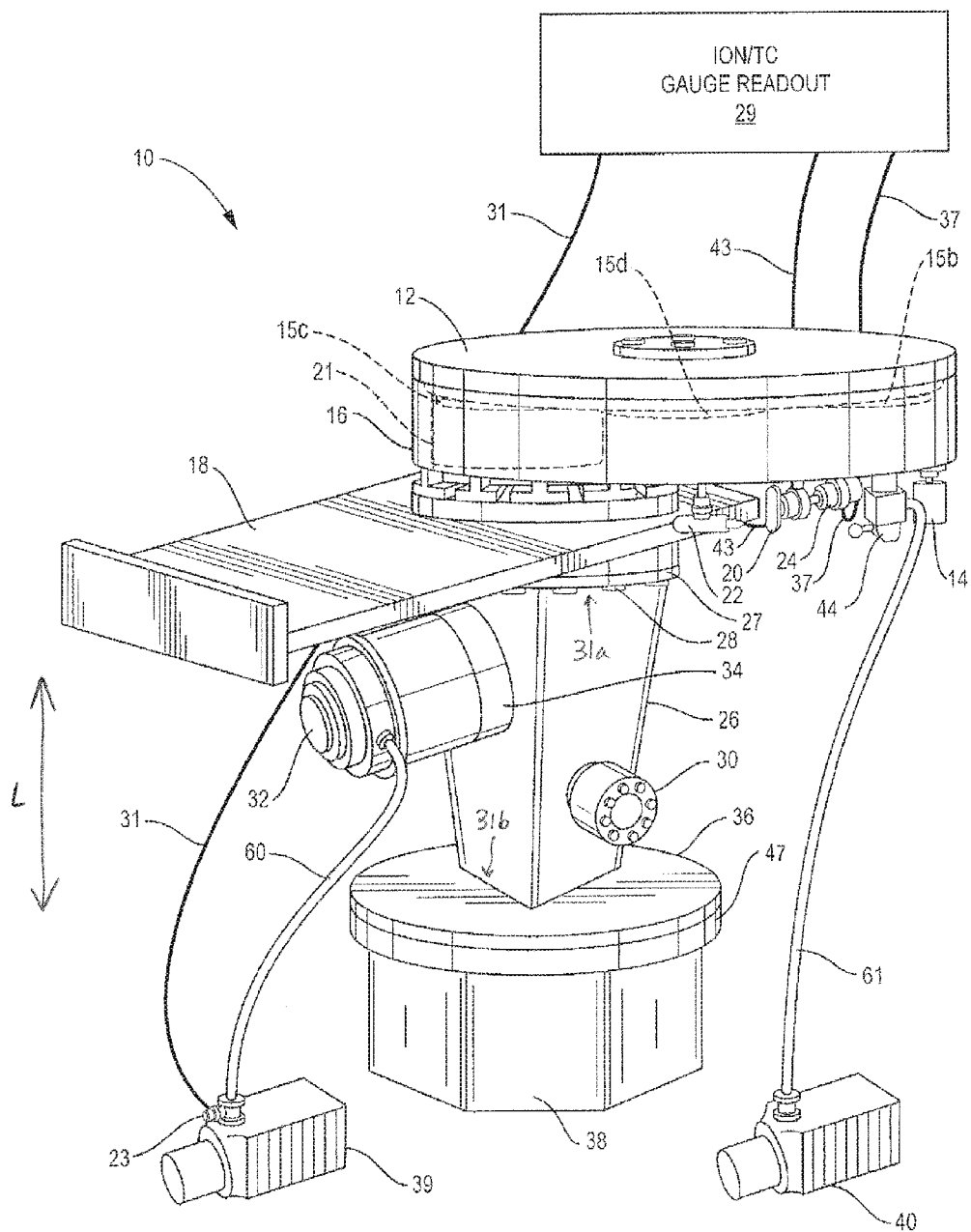
FIG. 2 is a front perspective view of an operational physical vapor deposition apparatus having a tapered high vacuum chamber with a turbo pump according to exemplary embodiments of the present disclosure.
Figure 3:
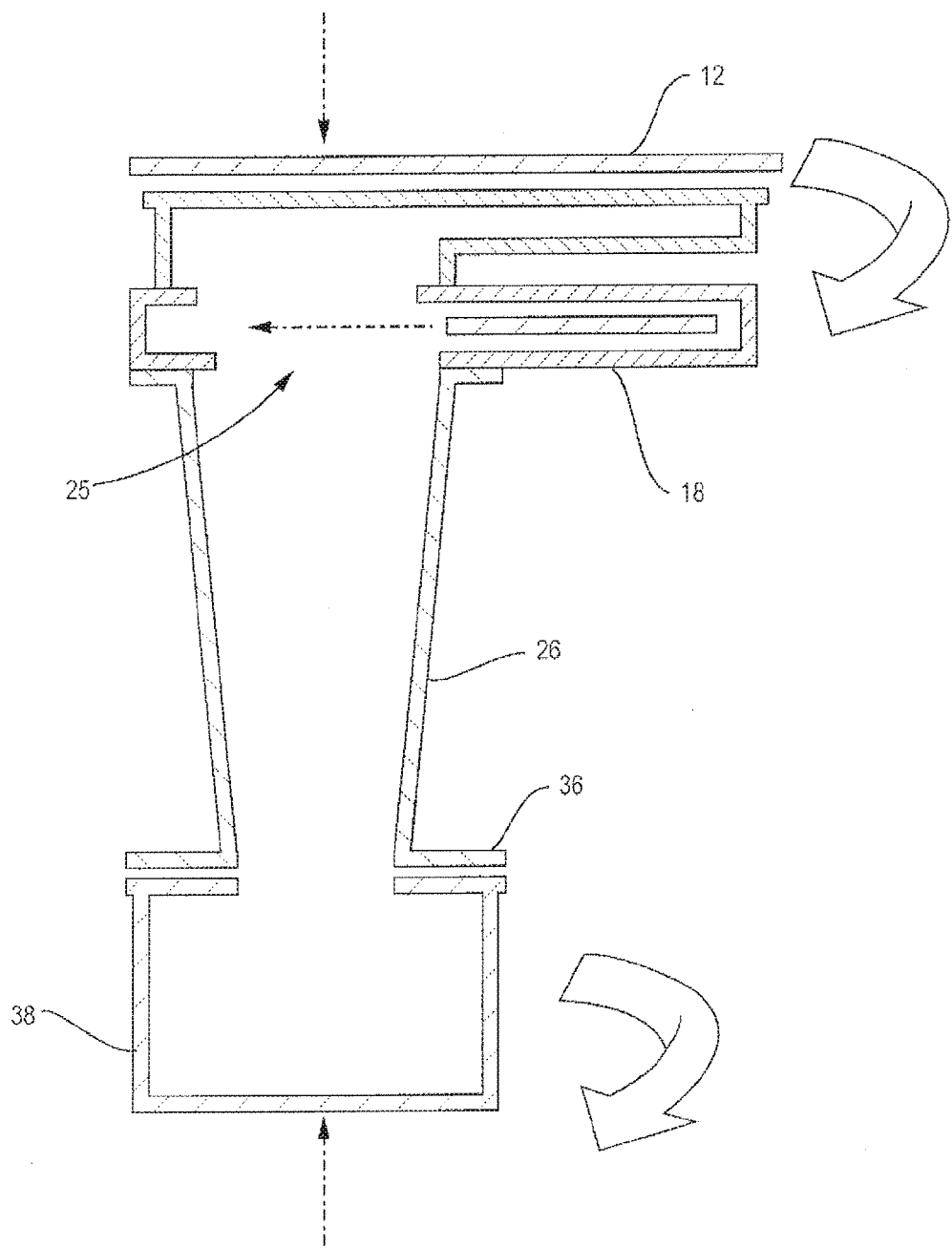
FIG. 3 is a simplified cross-sectional view of the physical vapor deposition apparatus of FIG. 2 (without the high vacuum turbo pump attached) showing a tapered high vacuum chamber having a top lid that rotates outward for loading a wafer planetary and a source chamber that rotates outward for loading metal to be evaporated.

FIG. 2 is a front perspective view of an exemplary embodiment of a physical vapor deposition apparatus 10. FIG. 3 is a cross-sectional view of the physical vapor deposition apparatus 10 of FIG. 2, omitting a high vacuum pump for clarity. FIG. 19A depicts a downward view of an apparatus similar to the apparatus 10. FIG. 20A depicts a side view of an apparatus similar to the apparatus 10.

Referring to FIGS. 2 and 3, the physical vapor deposition (PVD) apparatus 10 can be used, for example, to coat silicon wafers, solar cells, and/or any other suitable parts that receive coatings. In exemplary embodiments, the (PVD) apparatus 10 can be operable to deposit ultra-thin and ultra-uniform coatings having dimensions that are typically measured in nanometers, angstroms or microns. In some embodiments, the PVD apparatus 10 can be used with thermal evaporation sources, sputtering sources, ion mill sources, etching electrodes, and/or any other high vacuum process that would generally benefit from fast pump down times (e.g., the time required to decrease the pressure from atmospheric pressure to a specified pressure level).

Figure 5:
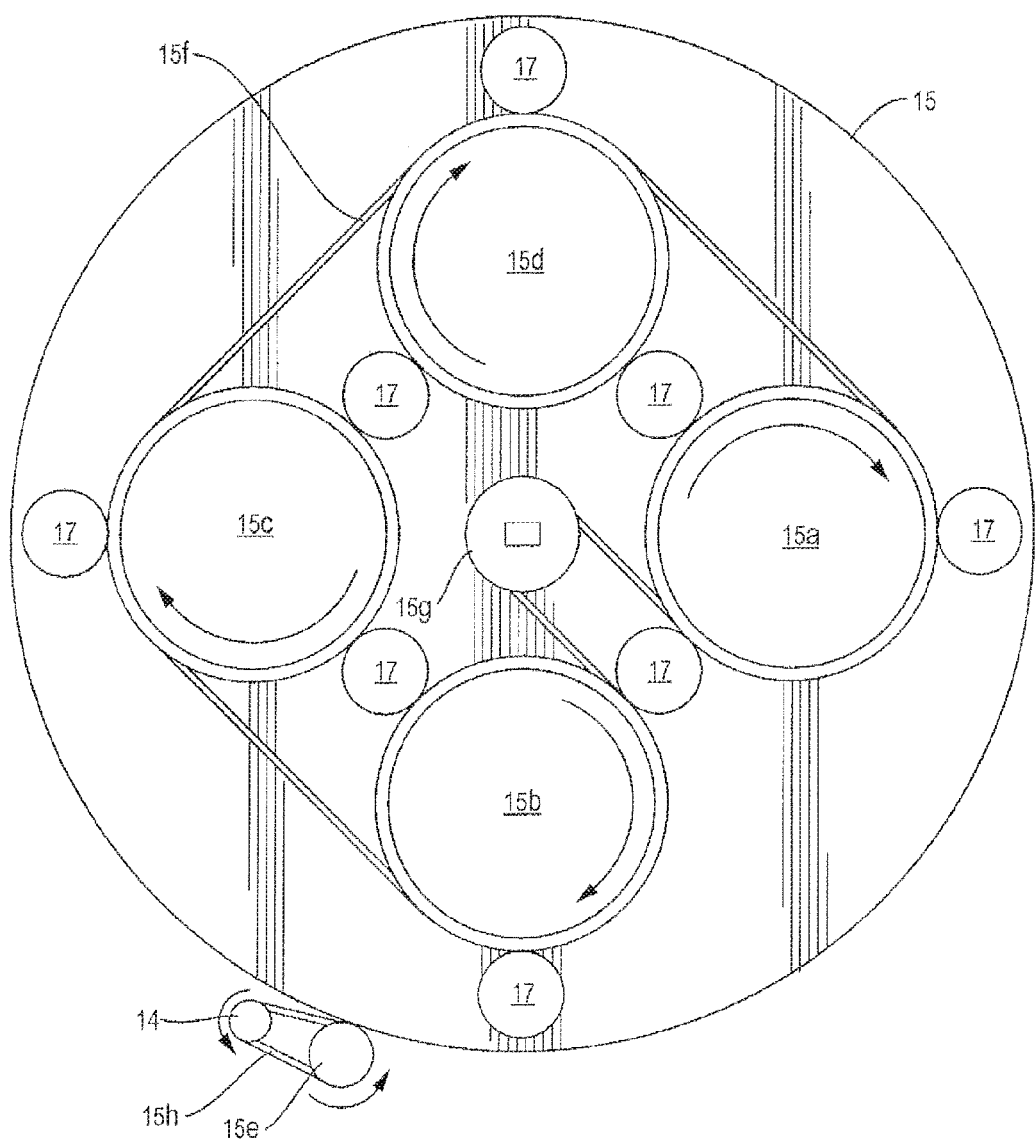
FIG. 5 is a bottom plan view of a planetary for holding four rotating wafers that can be loaded in a load-lock deposition chamber as one assembly according to exemplary embodiments of the present disclosure.
Figure 23:
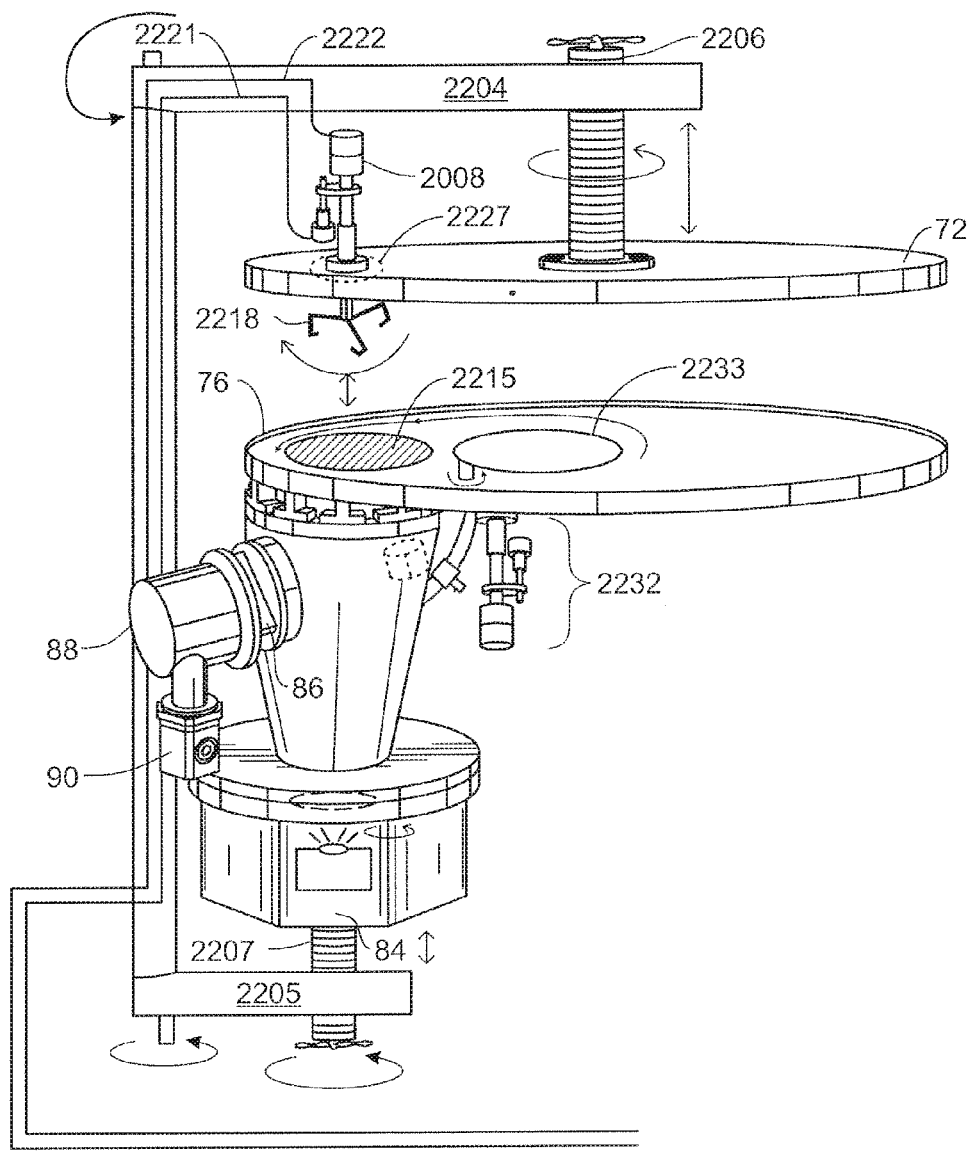
FIG. 23 is a front perspective view of an operational physical vapor deposition apparatus having an alternative locking valve according to exemplary embodiments of the present disclosure.

As depicted in FIG. 2, the PVD apparatus 10 can include a removable top lid 12, a load-lock deposition chamber 16, tapered high vacuum chamber 26, and a removable source chamber 38. The load-lock deposition chamber 16 has a generally cylindrical configuration. A rotary feed through 14 is disposed proximate to a bottom circumference of a load-lock deposition chamber 16. The load-lock deposition chamber 16 houses a planetary 15 (FIG. 5). The planetary 15 may be embodied by a dual-axis assembly and can be stackable to allow more wafers to fit in a load-lock deposition chamber 16 without increasing the diameter of the deposition chamber 16. A load-lock valve 18 is disposed between and attached to a bottom of the deposition chamber 16 and a top of the high vacuum chamber 26. In an alternative embodiment, as seen in FIG. 23, a rotating valve can be incorporated that can be composed of a small disc with an embedded O-ring beneath and close to the perimeter, that can be just large enough to cover the bore of the load lock deposition chamber 16. In exemplary embodiments, the load-lock valve is operable to selectively close and/or seal a bottom of the deposition chamber 16 and a top of the high vacuum chamber 26.

The high vacuum chamber 26 can extend along a longitudinal axis L from a first end 31a to a second end 31b. The high vacuum chamber can taper inwardly from the first and the second end so that a cross-sectional area of the second end is less than the cross-sectional area of the first end. For example, in one embodiment, a ratio between the cross-sectional area of the second end to the cross-sectional area of the first end can be approximately 3:4. In exemplary embodiments, the first end 31a of the high vacuum chamber 26 can be attached to the load-lock valve 18 with bolts 28 and can have tapered rectangular sides that terminate at a flange 36 at the second end 31b. A view port or sight glass 30 can be bolted with an O-ring seal to a welded flange on one side of the high vacuum chamber 26, and a turbo pump 32 can be attached to an adjacent side of the chamber 26 via clamps with an O-ring seal to a welded flange 34.

The source chamber 38 has an upper flange that attaches to the flange 36 with an O-ring seal to the high vacuum chamber 26. In the present embodiment, the walls of the source chamber 38 have an octagon shape making it easier to drill holes or weld flanges for vacuum feedthroughs that control one or more evaporation sources disposed within the source chamber 38. In exemplary embodiments, an evaporation source, such as an electron-beam gun, can be disposed with the source chamber 38. By implementing a tapered high vacuum chamber 26, exemplary embodiments of the present disclosure can reduce the time and energy consumed to decrease the pressure within the apparatus (by pumping down) to a specified pressure/vacuum level (e.g., to levels of about $1\times10^{-6}$ Torr or lower) and advantageously provides a smaller size and lower cost apparatus to accomplish such a vacuum level compared to prior art apparatus with comparable production capacity.

In exemplary embodiments, the lid 12 and source chamber 38 can be suspended by a large vertical c-clamp assembly with corresponding force bearing brackets and screws on a large steel shaft for vertical movement. In operation, the lid 12 and source chamber 38 can rotate outward, sliding on deep grooves in the shaft that are secured with large set screws that are not fully tightened. The vertical c-clamp assembly is not shown but known to one of ordinary skill in the art. The c-clamp may be similar to an oversized three way edge clamp, item 93547099 manufactured by Bessey Tools North America of Ontario, Canada.

The turbo pump 32 has a mechanical pump 39 connected with a vacuum hose 60 and clamps and a thermocouple (TC1) gauge 23 for reading rough vacuum levels. In an alternate configuration the apparatus 10 can operate with one rough pump, if a valve controller is added with a manifold and extra valving, allowing the rough pump vacuum to switch from the turbo exhaust to the load-lock deposition chamber 16. This configuration is comparable in cost but has no functional advantage. The load-lock deposition chamber 16 has a mechanical pump 40 connected to it via a vacuum valve 44 and a TC2 gauge 24 reads rough vacuum. The rough vacuum valve 44 isolates the mechanical pump from high vacuum in the load-lock deposition chamber 16. An Ion/TC gauge readout 29 is connected to the load-lock deposition chamber 16 for reading high vacuum.

Figure 4:
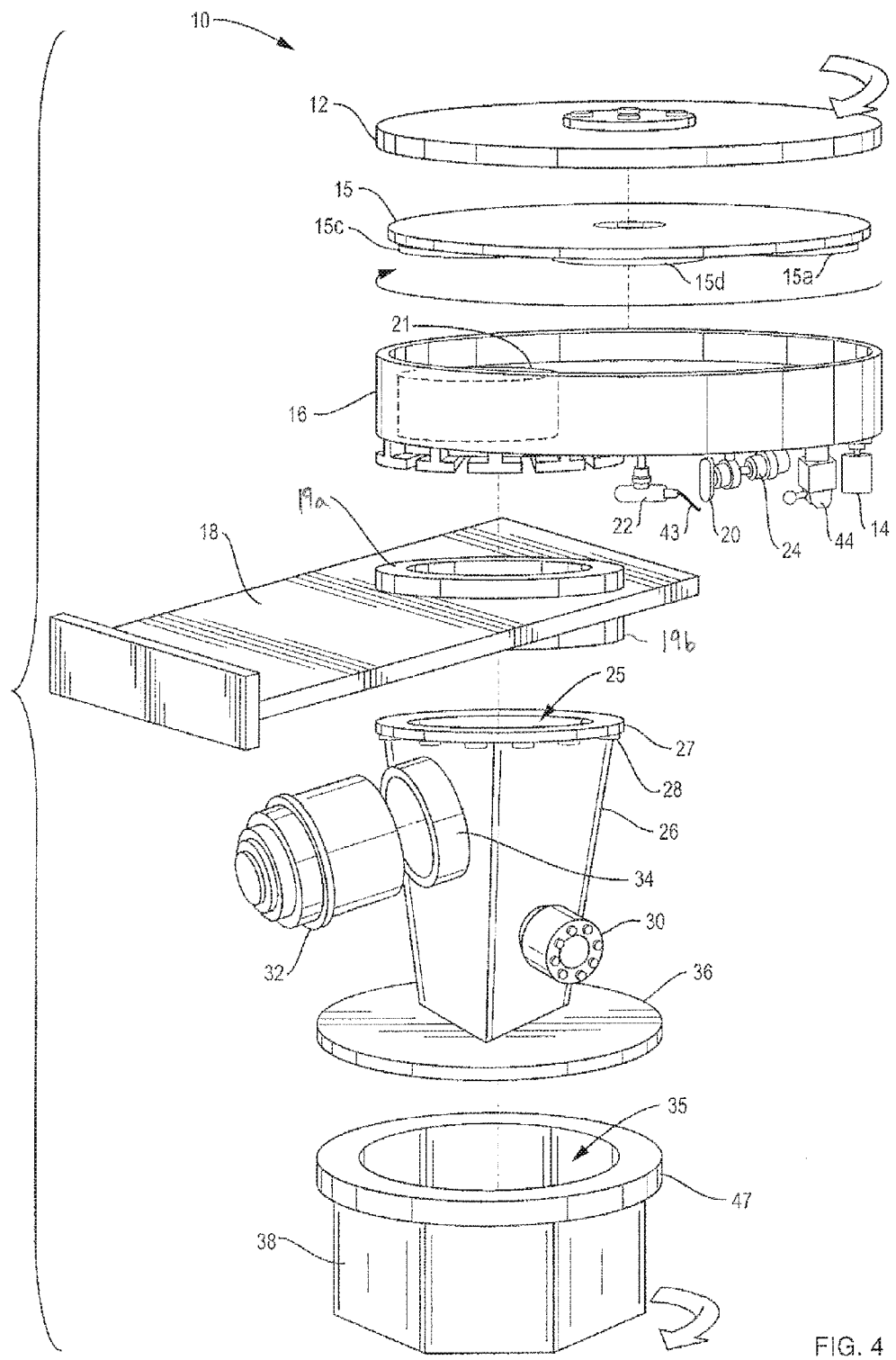
FIG. 4 is an exploded perspective view of the physical vapor deposition apparatus of FIG. 2.

FIG. 3 shows the vertical movement with rotation of the top lid 12 to allow products to be coated to be loaded on the planetary 15 in FIG. 4. Further, FIG. 3 shows the vertical movement and rotation of the source chamber 38 to allow access to the interior of the chamber so that material to be evaporated can be loaded into the source chamber 38.

FIG. 4 depicts an exploded perspective view of the physical vapor deposition apparatus 10 of FIG. 2. The top lid 12 can move up and rotate outwardly to allow the planetary 15 to be loaded into the deposition chamber 16. The rotation feed-through 14 disposed proximate to the bottom circumference of the deposition chamber 16 connects to a motor with a belt (not shown but known to one skilled in the art). The rotation feed-through 14 drives a wheel inside the load-lock deposition chamber 16 coupled to the rotation feed-through, as described in more detail below, to rotate the planetary 15 (FIG. 5). The feed through 14 is located on the bottom circumference of the load-lock chamber 16.

A top of the load-lock deposition chamber 16 can be selectively sealed by the top lid 12 and the planetary 15 can rest within the chamber 16. In one embodiment, the deposition chamber 16 can be approximately nineteen inches in diameter and five inches thick, bored approximately one-half inch for a single planetary 15 (FIG. 5) with an inside diameter of approximately eighteen inches. The bored out cylinder forms the deposition chamber 16 and houses the planetary 15 which holds the parts to be coated. A second bore 21 which is off-set from the center of the deposition chamber 16 is made in the bottom of the deposition chamber 16. In one embodiment, the second bore 21 can be approximately nine inches in diameter. The second bore 21 provides the path for deposition material rising from the source chamber 38 to reach the wafers in the deposition chamber 16 when the load-lock valve 18 is open.

Still referring to FIG. 4, an upper portion 19A of the load-lock valve 18 attaches to the bottom of the deposition chamber 16 by via, for example, bolts and an O-ring seal an a lower portion 19B attaches to the high vacuum chamber 26, for example, via bolts and an O-ring seal. The load-lock valve 18 has a lever (not shown) for sliding a metal disc horizontally and then vertically over an orifice 25 formed in the top of the high vacuum chamber 26 to make an O-ring seal. The load-lock valve 18 enables the load-lock deposition chamber 16 to separate the chambers 16 and 26 to allow the deposition chamber 16 to be at atmospheric pressure when it is time to load or unload wafers on and off the planetary 15 while the high vacuum chamber 26 maintains a specified pressure/vacuum level (e.g., $1\times10^{-6}$ Torr or lower).

The load-lock deposition chamber 16 can include a vent valve 20, an ion gauge 22, a thermocouple (TC2) gauge 24 and a rough vacuum valve 44. The vent valve can be operable to vent the interior of the chamber 16 to bring the chamber 16 to atmospheric pressure when the load-lock valve separates the chambers 16 and 26. The load-lock deposition chamber 16 has threaded Teflon coated connections or a welded flange to a vacuum hose 61 clamped to a vacuum pump 40 through a small rough vacuum valve 44 in FIG. 2 providing the means to bring the vacuum level in the load-lock deposition chamber 16 under 100 millitorr. Such a dual-stage vacuum pump may be embodied by model D16B, manufactured by Oerlikon of Churerstrasse 120 8808 Pfäffikon Switzerland. The load-lock deposition chamber 16 has threaded coated connections to vacuum gauges in order to read vacuum levels inside the chamber. The Ion/TC Gauge readout 29, connected to TC2 23, TC2 24 and Ion Sensor 22 (as shown by lines 31, 37, and 43 respectively), may be embodied by Model 934, manufactured by Duniway Stockroom of Mountainview, Calif. The TC1 23 and TC2 24 gauges may be embodied by a model 0531 manufactured by Varian of Palo Alto Calif. The ion vacuum gauge 22 may be embodied by model 0564-k25 manufactured by Varian of Palo Alto, Calif. The small rough vacuum valve 44 may be embodied by Model SFM1122-25 manufactured by Duniway Stockroom of Mountainview, Calif. The load-lock valve 18 may be embodied by a gate vacuum valve, model DN200 manufactured by VAT of Haag, Switzerland.

The bottom of the high vacuum chamber 26 has a flange 36 to which the source chamber 38 is clamped and sealed with an O-ring. The turbo pump 32 attaches to a hollow flange 34 welded to one of the rectangular sides of the tapered high vacuum chamber 26, and a viewing window 30 is provided on another side of the high vacuum chamber 26. The turbo pump 32 may be embodied, for example, by model NEXT 400D manufactured by EDWARDS of CROWLEY, UK.

The high vacuum chamber 26 can be formed of stainless steel. A flange 27 can be welded to the top of the chamber 26, and in one embodiment the flange 27 can be approximately eleven and one-half inches in diameter. The flange 27 provides a surface for attaching the high vacuum chamber 26 to the load-lock valve 18 with an O-ring seal and bolts 28.

The high vacuum chamber 26 is tapered from the top to the bottom. In one embodiments, the top of the high vacuum chamber 26 can have an inside dimension of approximately 8×8 inches and an 11.5 inch outside dimension with the flange 27 on top. In one embodiment, the bottom of the high vacuum chamber 26 can have an inside dimension of approximately 6×6 inches, and another flange 36 welded to the bottom of the high vacuum chamber 26 can have an outside diameter of approximately 16 inches to provide a surface for mating to the source chamber 38 located below it with an embedded O-ring.

The sight glass 30 is mounted to a flange welded to the side of the high vacuum chamber 26 permits viewing the source indirectly via a mirror mounted inside the high vacuum chamber and pointing downwardly so the sight glass 30 is not coated. The sight glass 30 may be embodied, for example, by model ZV200 manufactured by NORCAL of ROUNDROCK, Calif.

An evaporation source, such as an electron beam gun, disposed within the source chamber 38 may be embodied, for example, by model 4×24 EB19900 manufactured by Island EBeam LLC of Brandenton, Calif. In one embodiment, the source chamber 38 can be formed of a stainless steel octagon having an inside diameter of approximately twelve inches. A flange 47 having an outside diameter of approximately sixteen inches can be welded to the top of the source chamber 39, which can be grooved at approximately fourteen and one-half inches to hold an O-ring. In one embodiment, the inside height of the octagonal source chamber 38 can be approximately six inches. The top flange 47 of the source chamber 38 can mate with the flange 36 on the bottom of the high vacuum chamber 26, as described herein.

Referring to FIG. 5, a bottom plan view is shown of a planetary 15. The arrows indicate rotation of the planetary 15 and rotation of wafer holders or rings 15a, 15b, 15c and 15d attached to the planetary 15. In the present embodiment, the planetary 15 can hold four 150 mm wafers. Each of the rings 15a-15d can be rotated about their own axis (e.g., their respect center axes) while the planetary 15 can rotate about its center axis to rotate the rings 15a-15d in a circle about the center axis of the planetary. Wafers in rings 15a-15d can be held in place, for example, with bearings 17 having lips 13 (FIG. 8) inserted in grooves outside the rings. A belt 15f is disposed around the rings 15a-15d and wraps around a stationary grooved disc 15g facilitates rotation of each ring 15a-d about its own axis. When the vacuum feedthrough shaft 14 spins, the small belt 15h drives a shaft 15e that makes contact with the planetary 15 to rotate the planetary 15. The purpose of shaft 15e is to withstand stress that the vacuum feedthrough cannot withstand when the planetary is pressed down in place. The assembly allows the wafer planetary 15 to be perfectly positioned for rotation and minimal slippage or stress to fragile planetary 15 components.

Figure 8:
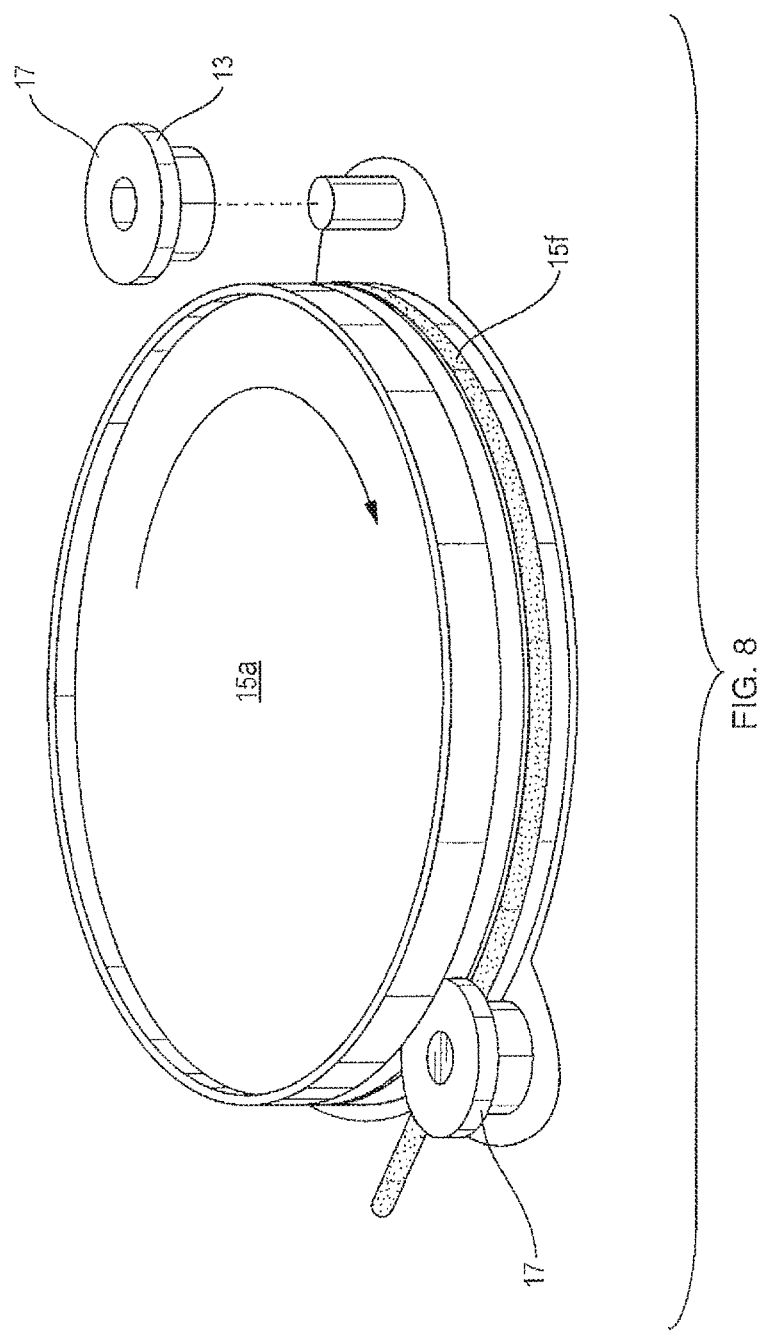
FIG. 8 is a front perspective view of a wafer ring of a planetary showing a belt for rotating the wafer rings and a bearing which rides on a counter bored shaft protruding from the bottom of a planetary disc according to exemplary embodiments of the present disclosure.

FIG. 8 depicts the wafer holding ring 15a, bearings 17 and belt 15f in more detail. The bearings 17 have lips 13 on the top to secure a position of the ring 15a and a relationship of the ring 15a to the belt 15f while rotating. The bearings 17 are held on counter bored shafts in the planetary 15. In one embodiment, the wafer planetary rings 15a-15d are one quarter inch in height.

An exemplary method for operating the physical vapor deposition apparatus 10 in FIG. 2 can include one or more of the following steps:

1. Initial pump down (system is powered off)
2. Ensure all valves are closed.
3. Ensure top lid 12 and bottom source chamber 38 are sealed.
4. Turn on system main power.
5. Open high vacuum load-lock valve 18.
6. Turn on mechanical vacuum pump #1 39.
7. Turn on turbo pump 32 after reading 100 millitorr on TC1 vacuum gauge 23 for the high vacuum chamber 26.
8. Wait about 15 seconds after TC1 gauge 23 reads zero.
9. Turn on ion vacuum gauge 22 on the load-lock deposition chamber 18 and wait until the Ion/TC gauge 29 to read about 5×10-7 Torr (may take up to twelve (12) hours).

LOADING WAFERS (AFTER INITIAL PUMP DOWN)

10. Close high vacuum load-lock valve 18 (FAILURE TO DO SO CAN DAMAGE TURBO PUMP 32)
11. Open vent valve 20 on load-lock deposition chamber 16 and wait for chamber to reach atmospheric pressure.
12. Raise lid 12 and swing out toward the operator, to expose planetary 15.
13. Load the wafers in rings and place in planetary holders 15a-15d.
14. Swing lid 12 back to position centered over high vacuum chamber 26.
15. Lower top lid 12.
16. Turn on mechanical vacuum pump #2 40.
17. Open rough valve 44 on load-lock deposition chamber 16.

18. Wait for TC2 vacuum gauge 24 to read 100 millitorr on Ion/TC gauge readout 29.
19. Close rough valve 44.
20. Open high vacuum load-lock valve 18.
21. Wait for ion gauge 22 to reach $1\times10^{-6}$ Torr (or better) on Ion/TC gauge readout 29.
22. System is now ready for evaporation source 35 to be turned on.

REMOVING WAFERS (AFTER BEING COATED)

23. Close high vacuum load-lock valve 18.
24. Open vent valve 20.
25. Wait for load-lock deposition chamber 16 to reach atmospheric pressure.
26. Raise top lid 12 and remove coated wafers.

Figure 6:
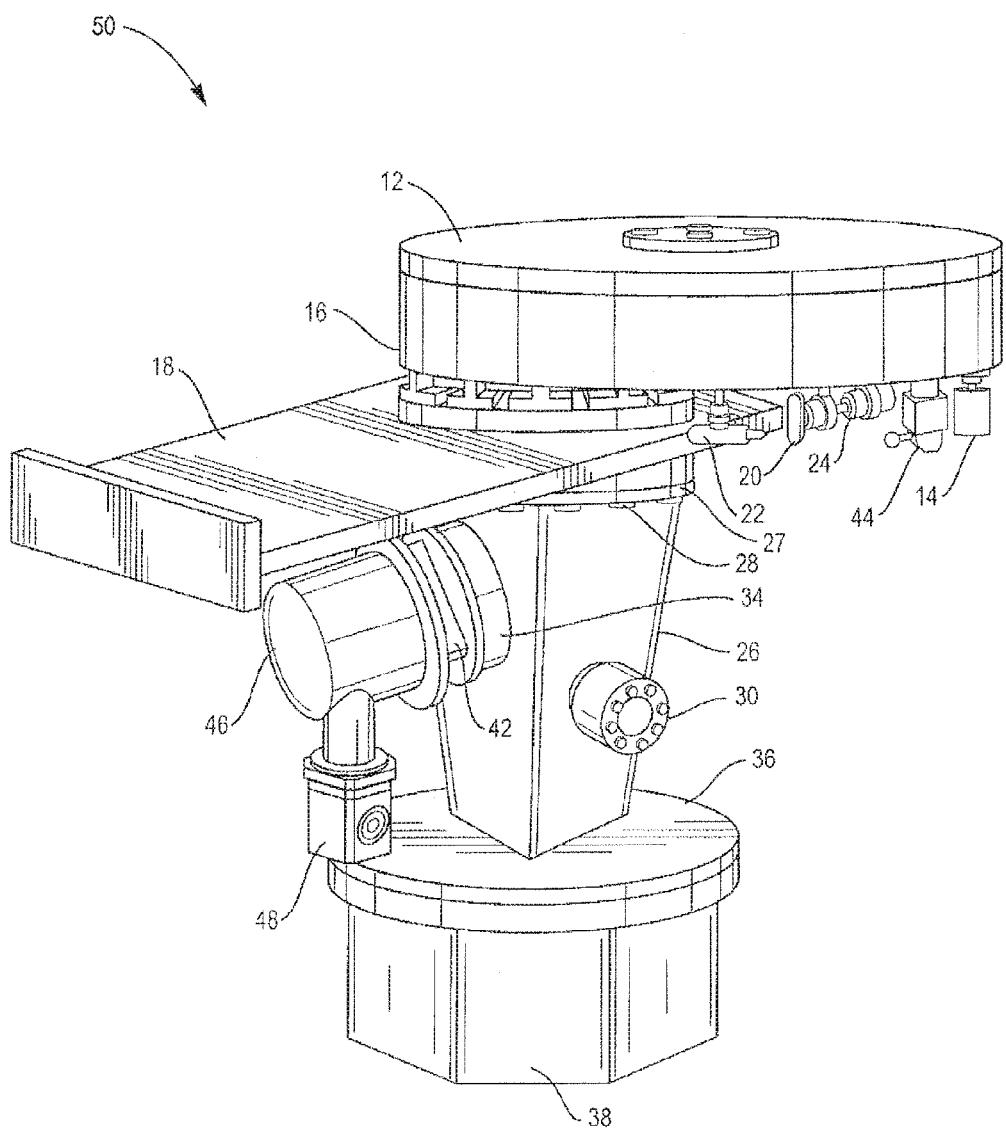
FIG. 6 is a front perspective view of an alternate embodiment of a physical vapor deposition apparatus having a cryopump on a side of the high vacuum chamber according to exemplary embodiments of the present disclosure.

Referring now to FIG. 6, a front perspective view of an alternate embodiment of a physical vapor deposition apparatus 50 is shown having a tapered load-lock high vacuum chamber 26 with a load-lock gate valve 42 and a cryopump 46 mounted on a side of the high vacuum chamber 26. Load-lock gate valve 42 can be configured to move linearly to isolate the deposition chamber 16 from the source chamber 38. FIG. 19A depicts a downward view of an apparatus similar to the apparatuses 10, 50, 70 and 2200. FIG. 20A depicts a side view of an apparatus similar to the apparatuses 10, 50, 70 and 2200. This alternate embodiment is similar to the embodiment of FIG. 2 having the same load-lock deposition chamber 16, load-lock valve 18, tapered high vacuum chamber 26 and source chamber 38. However, the turbo pump 32 is removed and instead a second gate valve 42 is coupled between the cryopump 46 and the flange 34. The cryopump may be embodied by model 8F, manufactured by Brooks Automation of Chelmsford, Mass.

The physical vapor deposition apparatus 50 of the present disclosure including the tapered load-lock high vacuum chamber 26 can coat parts faster than prior art PVD systems having conventional high vacuum chambers. In an exemplary operation of the PVD apparatus 50, the evaporation source 35 in the source chamber 38 directs an evaporated coating agent directly to the load-lock deposition chamber 16. The parts to be coated are loaded in the planetary 15 in the deposition chamber 16. When the parts to be coated are loaded, the cryopump 46 may already have the high vacuum chamber 26 at a reasonable vacuum level (for example, below $1\times10^{-6}$ torr).

Figure 7:
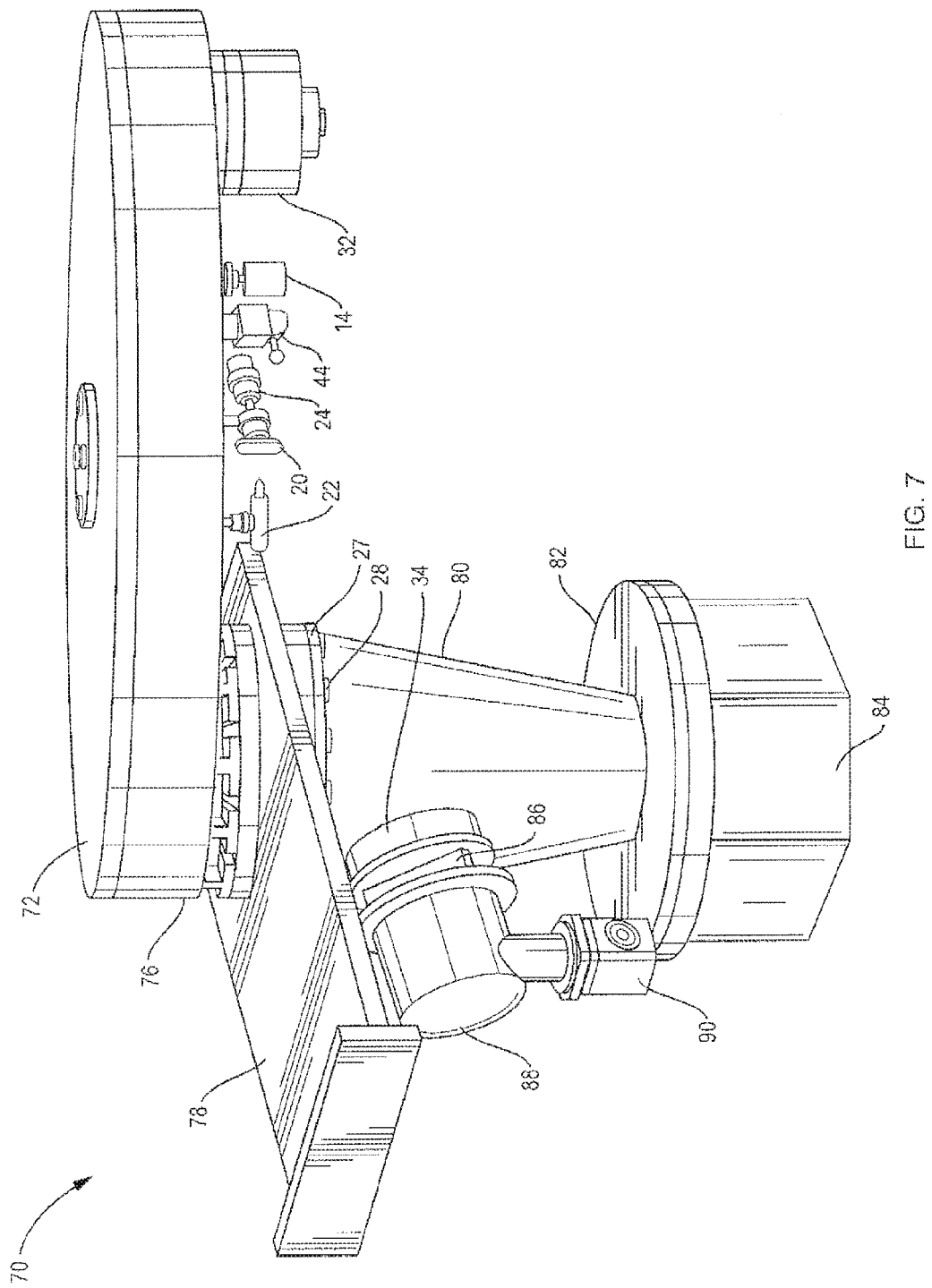
FIG. 7 is a front perspective view of another embodiment of a larger physical vapor deposition apparatus having a truncated cone shaped high vacuum chamber and a cryopump on a side of the high vacuum chamber for processing larger wafers or large quantities of smaller wafers according to exemplary embodiments of the present disclosure.

Referring to FIG. 7, a front perspective view of another embodiment of a physical vapor deposition apparatus 70 is shown having a truncated cone-shaped high vacuum chamber 80. FIG. 19A depicts a downward view of an apparatus similar to apparatuses 10, 50, 70 and 2200. FIG. 20A depicts a side view of an apparatus similar to apparatuses 10, 50, 70 and 2200. A cryopump 88 is attached to a load-lock valve 86 on the side of the tapered high vacuum chamber 80. This embodiment is a larger version of tapered load-lock chambers 10, 50 for coating large parts or for high production. Therefore, the load-lock deposition chamber 76 is much larger with the cryopump 88 mounted on the side of the high vacuum chamber 80. In addition, a turbo pump 32 is mounted to the bottom of the load-lock deposition chamber 76 (with exhaust connected to another rough vacuum pump, such as rough vacuum pump 39 in FIG. 2, as required by the turbo pump) to increase pump down speed. Another gate valve (not shown) could also be added between the load-lock deposition chamber 76 and the turbo pump 32 to isolate the turbo pump 32 and further increase the pump down speed.

A space immediately outside of the tapered high vacuum chamber 26 between the top plate and bottom flange 36 is generally required by prior art PVD apparatus. However, exemplary embodiments having the tapered high vacuum chamber 26 of the present disclosure can be advantageously constructed and operated without such dead space. The tapered PVD apparatus of the present disclosure advantageously reduces the operating energy cost compared to conventional PVD system because it takes less time and less power to reach pressure/vacuum levels acceptable for deposition (typically less than $1\times10^{-6}$ Torr) compared to conventional PVD systems.

In addition, the overall size of exemplary embodiments of the PVD apparatus described herein is significantly smaller than prior art physical vapor deposition apparatus. The tapered shape of the high vacuum chamber 26 advantageously reduces the volume of the chamber 26 required for any size load. Reducing the volume advantageously reduces the pump down time (typically the longest part of the deposition process cycle time).

Figure 9:
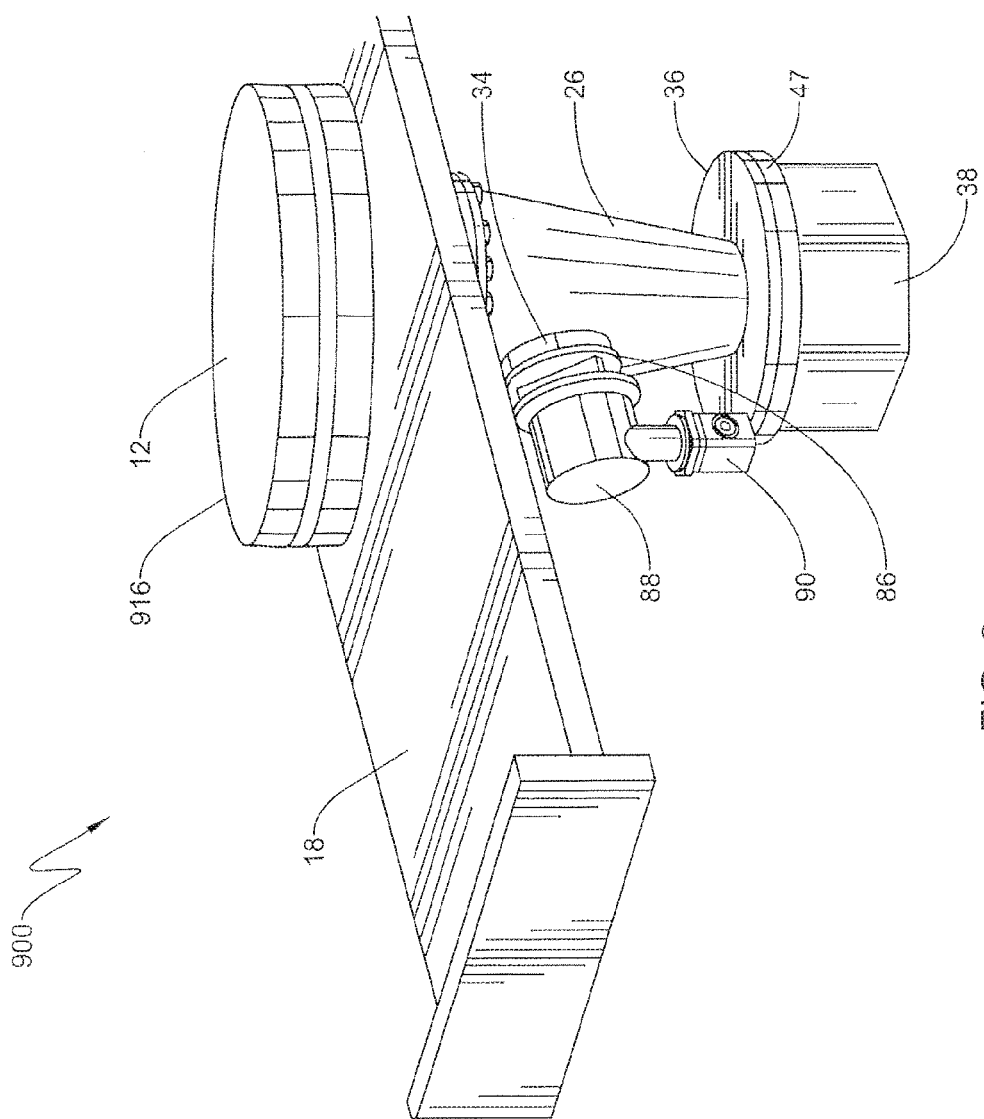
FIG. 9 is a front perspective view of a centered load-lock deposition chamber which can simultaneously coat all wafers in the chamber according to exemplary embodiments of the present disclosure.

According to FIG. 9, and depicted further in FIGS. 19B and 20B, an exemplary PVD apparatus 900 is shown where all the wafers loaded can be simultaneously coated. In this exemplary embodiment, a load-lock deposition chamber 916 can be centered over the high vacuum chamber 26 such that the an opening to the deposition chamber 916 formed by a bore is formed about the center axis of the deposition chamber 916 and vertically aligned with an opening in the high vacuum chamber 26, rather than offset as was depicted, for example, with respect to PVD apparatuses 10 and 50. For embodiments in which the deposition chamber 916 is centered over the high vacuum chamber 26, the diameter of openings in the chamber 916 and/or chamber 26 can be larger than previous embodiments to accommodate a larger load-lock deposition chamber 916, and the load-lock valve can be much larger to seal and isolate the opening of the chamber 916 from the chamber 26. Isolation between the chambers 916 and 26 allows the chamber 916 to be at atmospheric pressure while the high vacuum chamber 26 maintains an operational pressure/vacuum level (e.g., (typically $1\times10^{-6}$ Torr) when loading of product to be coated.

Figure 10:
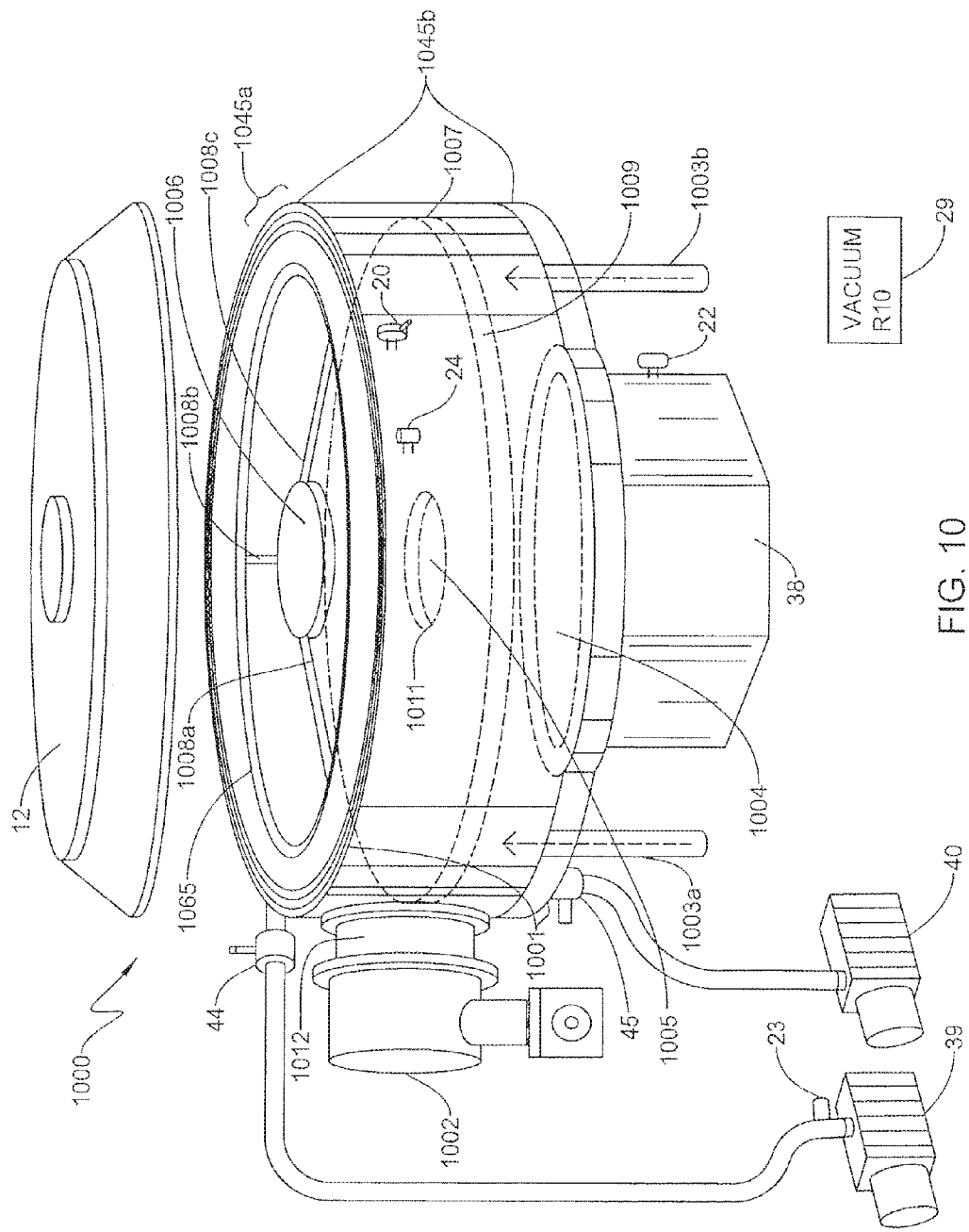
FIG. 10 is a front perspective view of a physical vapor deposition apparatus implementing a ring valve for coating all the wafers in the chamber simultaneously according to exemplary embodiments of the present disclosure.

According to FIG. 10, and depicted further in FIGS. 19C and 20C, another embodiment of a PVD apparatus 1000 is shown having a structure and operational characteristics enabling the system to simultaneously coat a plurality of wafers. Here, the load-lock deposition chamber 16 can be seen as element 1045a. Though a vacuum chamber (e.g., the high vacuum chamber 26) is labeled 1045b in FIG. 10

In the embodiment depicted in FIG. 10, the deposition apparatus 1000 includes a ring valve 1001 similar to that of the load-lock valve 18. The ring valve 1001 can include a ring portion 1007 and a central seal portion 1006. The inner diameter of the ring 1011 is slightly smaller than the sealing surface of the suspended disc 1006 above it. The outer diameter 1009 of the moving ring 1007 is slightly larger than the ring 1065 that is welded to the inside of the chamber between 1045a and 1045b. The ring valve 1001 can be configured to move vertically to isolate the deposition chamber 1045a from the source chamber 38. The load-lock chamber can accept and spin a carousel loaded with flat parts, and can expose all or a portion of the entire carousel to deposition, while also reaching high vacuum levels very quickly.

While the load lock valve 18 can protrude outwardly from the PVD apparatus, the ring valve 1001 does need not extend outwardly from the deposition apparatus 1000, and consequently, does not fill as much of the volume surrounding the deposition apparatus 1000 as compared to other exemplary embodiments described herein.

The apparatus 1000 can include an upper portion 1045a and a lower portion 1045b and a source chamber 38. The load locked deposition chamber 1045a can be formed by lowering the tapered lid 12 with the ring 1007 raised. Coating material can pass from source chamber 38 into the lower 1045b and upper 1045a portions via central bores 1004 and 1005 when ring valve 1001 is in the open position (e.g., when the ring 1007 is lowered away from the central seal portion 1006).

Two or more pistons 1003a-b can be used to move the ring valve between an open and closed position (e.g., by lowering the ring portion 1007 of the ring valve 1001 away from the central seal portion 1006 and by raising the ring portion 1007 of the ring valve 1001 towards the central seal portion 1006, respectively). For example, when the pistons 1003a-b raise ring portion 1007 of the ring valve 1001, the central opening 1005 can engage the central seal portion 1006 to move the ring valve 1001 to the closed position. In exemplary embodiments, central seal 1006 can be supported by welded stainless steel bars 1008a, 1008b and 1008c. The central seal 1006 can be machined around its lower circumference to create a vacuum-sealing lip underneath. In some embodiments, central seal 1006 seals the bottom of the deposition chamber with o-rings on top of the ring 1007, embedded around central opening 1005 and inside the outer circumference 1009.

A mechanical vacuum pump 39 can provide rough vacuum of the load lock deposition chamber 1045a when valve 44 is opened. A second mechanical vacuum pump can provide rough vacuum to the high vacuum chamber 1045b when valve 45 is opened. A cryopump 1002 can ensure adequately high vacuum within the high vacuum chamber 1045b. The cryopump 1002 can be selectively isolated from the high vacuum chamber 1045b with a gate valve 1012.

Figure 11:
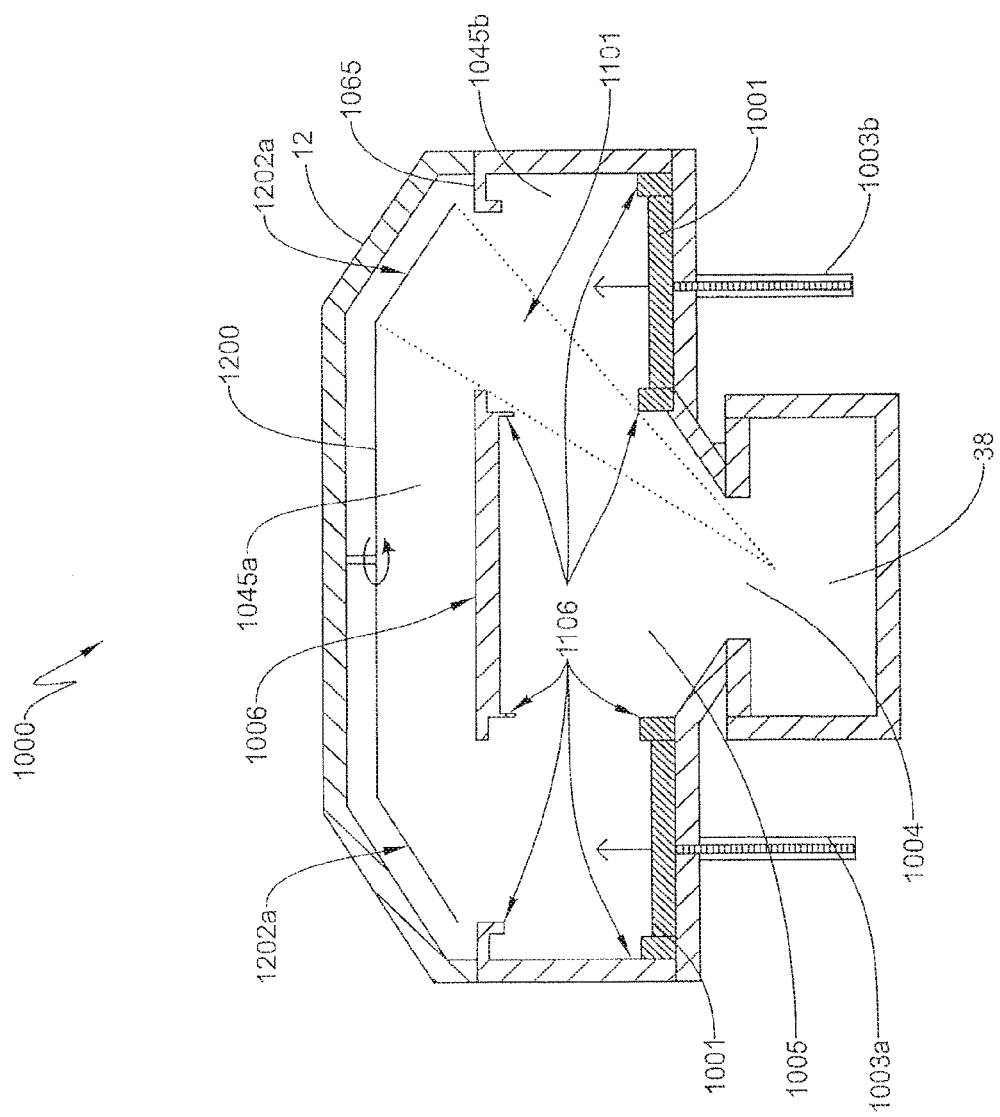
FIG. 11 is a cross-sectional view of the physical vapor deposition apparatus of FIG. 10.

FIG. 11 depicts a cross-sectional view of certain features of the deposition apparatus of FIG. 10. Particularly, FIG. 11 illustrates the deposition chamber when the ring valve 1001 is in its open position (e.g., when the ring portion of the ring valve 1001 is in a lowered position). A removable carousel system 1200 can spin within the load-lock deposition chamber 1045a, which can support one or more components/parts (e.g., wafers) to be coated by the PVD apparatus 1000. In exemplary embodiments, inner and/or outer edges of the ring valve 1001 can include raised portions, referred to herein as shields 1106. The shields 1106 can prevent the o-ring sealing surfaces from being coated during the deposition process while the ring 1007 is lowered and the ring valve 1001 is in the open position.

Figure 12:
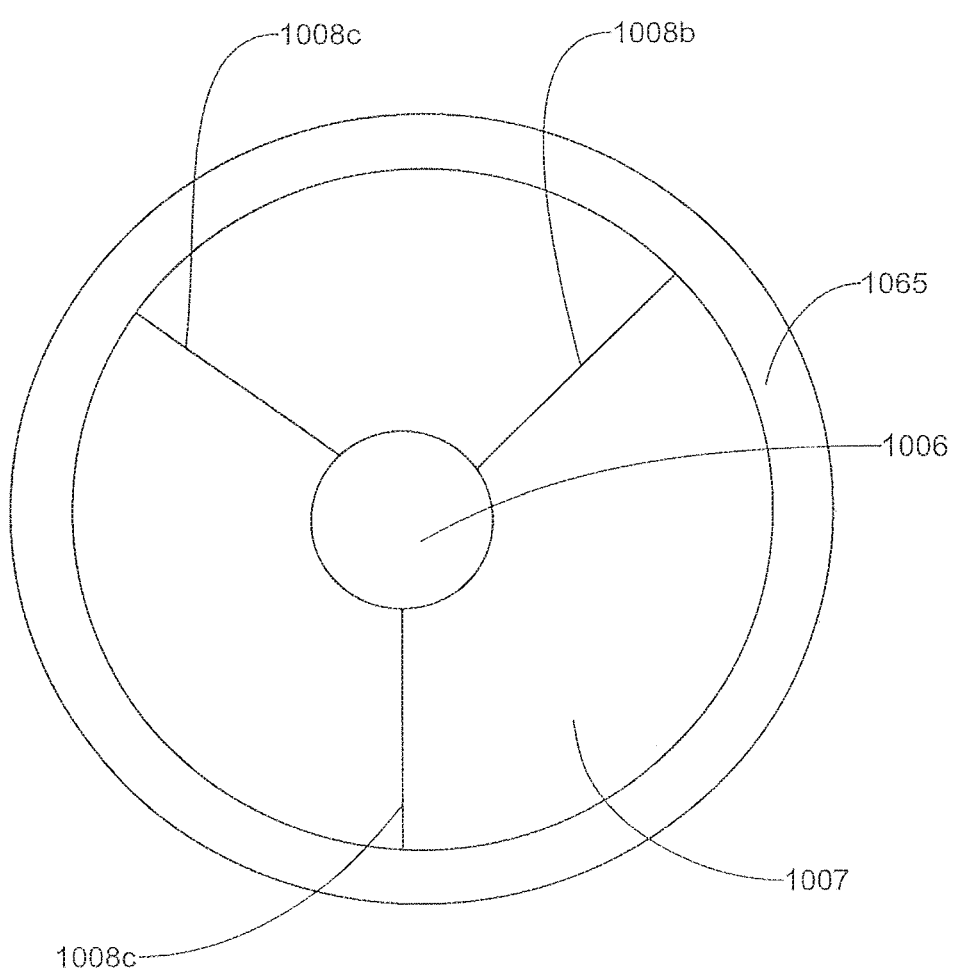
FIG. 12 is a top-down perspective view of certain features of the physical vapor deposition apparatus of FIG. 10 with the lid removed.

FIG. 12 is a top-down perspective view of certain features of the physical vapor deposition apparatus 1000 with the tapered lid 12 removed and the ring valve 1001 in the closed position (e.g., with the ring portion 1007 raised to engage the central seal portion). FIG. 12 depicts the central seal 1006, the top surface of ring portion of the ring valve 1001, the rim 1065, and stainless steel bars 1008a-c (one will understand that this is merely an exemplary view for purposes of explanation and that the geometry of the portion of the deposition apparatus receiving the lid can obscure or make visible various of these components). The stainless steel bars 1008a-c can be configured to support the central seal portion 1006.

The exemplary deposition apparatus 1000 can operate with some or all of the accessories including a wafer carousel or a planetary dome, as well as with vacuum gauges, a cryopump with gate valve, or a turbo pump. An exemplary vacuum sequence is described below.

1. With gate valve 1012 open, all other valves closed, the ring valve raised, some or all of the pumps on, and the source chamber 38 at about 1×10−6 torr or lower, load product to be coated into the load lock deposition chamber 1045a and close the lid.
2. Open the rough valve 44 and pump the load-lock deposition chamber 1045a to about 100 millitorr.
3. Close rough valve 44 and open (e.g., lower) ring valve 1001 to approximately equalize vacuum level between chamber 1045a and chamber 38.
4. Wait for the vacuum level in the load-lock deposition chamber 1045a to drop below about 1×10−6 Torr, and begin coating.

Wafers can be disposed on and rotated by the carousel or dome within load-lock deposition chamber 1045a as described in greater detail below with reference to FIGS. 14 and 15 to more evenly deposit material on each wafer.

Figure 13:
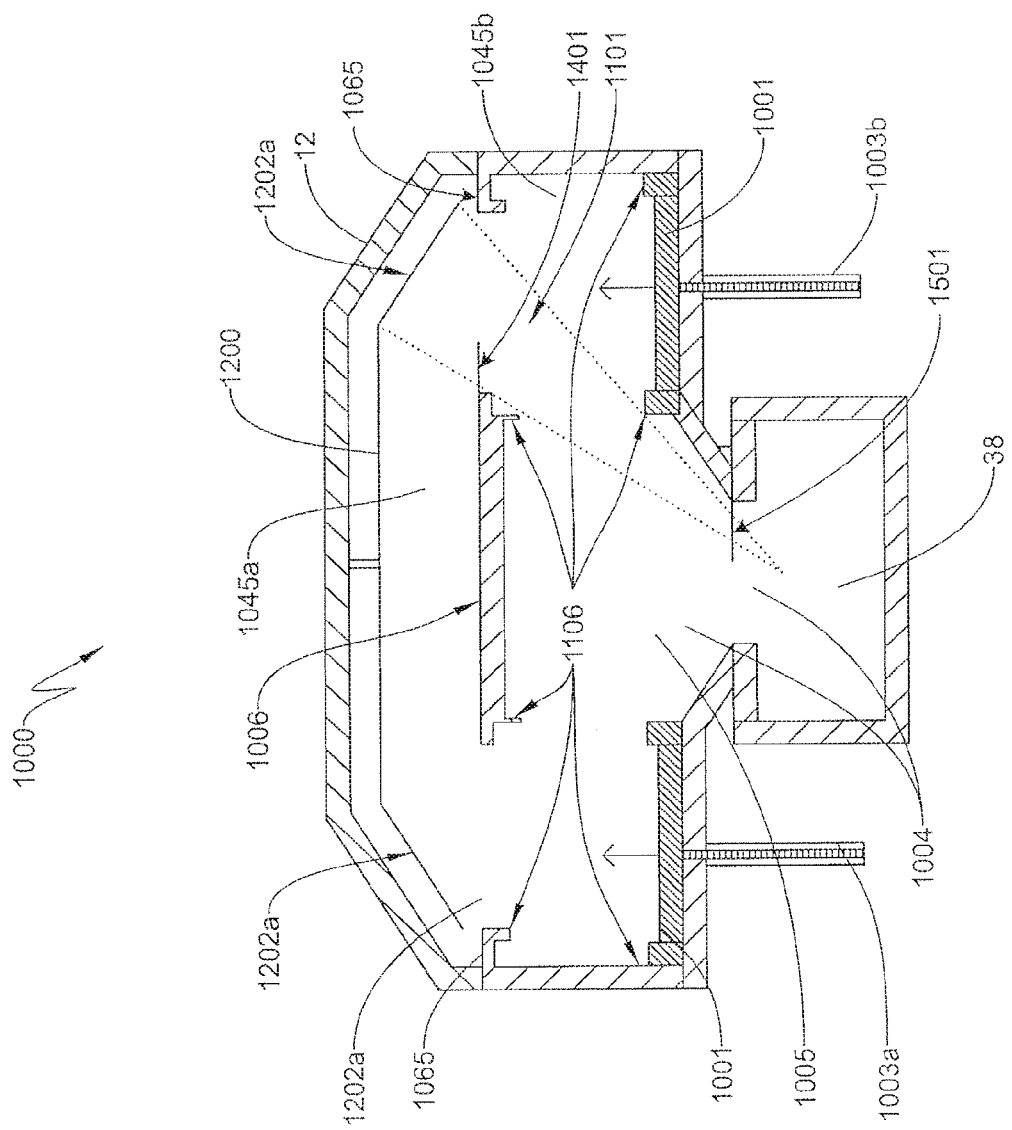
FIG. 13 is view of a an angled wafer planetary within the chamber of FIG. 11 and mask positions so as to receive a substantially even deposition of material.

FIG. 13 is a view of a wafer planetary or carousel 1200 within the deposition chamber 1000. Wafers can be disposed at an angle (with respect to a vertical axis) within to receive a substantially even deposition of material from the source chamber 38. When the ring portion of the ring valve 1001 is lowered to position the ring valve 1001 in the open position, coating material travels along path 1101 following evaporation, from the source chamber 38 to the wafers in the circumference of the load-lock deposition chamber 1045a. The deposition material travels upward in substantially a straight line within path 1101 from the source. During deposition, ring valve 1001 generally does not obstruct the path 1101 in its open position. Sealing portions, such as on the central opening 1005 and central seal 1006, can be exposed in the deposition areas. In some embodiments, these sealing portions can be shielded from the path 1101 during deposition to minimize degradation of the vacuum seals.

Placing wafers in the load-lock deposition chamber 1045a at an angle, permits the wafers (e.g., wafer 1201a from FIG. 19c) to be uniformly spaced away from the source disposed within the source chamber to promote a homogeneity and symmetry of the deposition. If the wafers are disposed vertically or horizontally in the deposition chamber it may be possible for the wafers (e.g., wafer 1201a), portions of the wafers may have lines of sight to the source chamber 38 of generally different lengths. As the coating varies with the distance to the source, this would adversely affect the homogeneity of the deposition. Portions of the wafer closer to the source would receive more source material than wafer portions further away. Accordingly, certain embodiments contemplate positioning each wafer at an angle (e.g., the wafer surface is normal to the path from the center of the source).

As described herein, the upper portion 1045a of the deposition chamber can also include a wafer transport system, such as a spinning carousel or dome, rotating the wafers relative to the source chamber 38 to further facilitate an even coating.

To enhance uniformity of the deposition, an exemplary stainless steel mask can be used. The stainless steel mask can reduce the deposition rate on or in areas of a wafer blocked by the mask, and can achieve an improved uniformity. For example, FIG. 13 depicts a mask 1401 placed in the bottom of the load lock deposition chamber 1045a. It should be noted that various alternative masking positions could be implemented. A mask 1501 can be mounted in the upper portion of the source chamber 38. In each location, the mask (e.g., elements 1401 or 1501) can alter or block a portion of the evaporation path of the coating material to improve deposition uniformity on the wafers.

Figure 14:
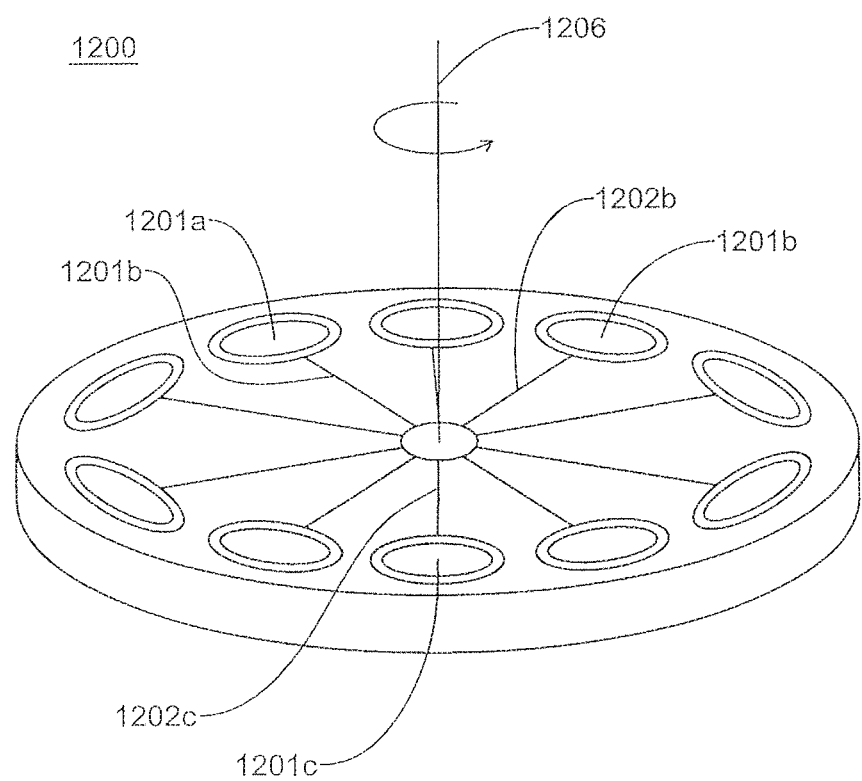
FIG. 14 depicts an example carousel wafer transport system suitable for use in certain embodiments.

FIG. 14 illustrates one example of an angled wafer carousel system. The carousel system 1200 can be located in the load-lock deposition chamber 1045a of exemplary embodiments (e.g., chambers 16, 76, and 916). Wafers 1201a-c can be placed on a periphery of a spinning carousel 1200. Spokes 1202a-c can support the carousel in certain embodiments. Each wafer 1201a-c can be mounted to a support apparatus on the carousel, such as a clip or recess, so that the wafer rests at the angle. In this manner, the wafers 1201a-c can be at an orientation conducive to an even, or radially symmetric, deposition of coating materials from the evaporation path 1101. A central shaft 1206 can be used to rotate the carousel 1200 within the deposition chamber. By rotating the wafers 1201a-c, exemplary embodiments can advantageously compensate for variations in asymmetric coating emissions from the source chamber 38. While the present embodiment is depicted as having spokes 1202a-c and a shaft 1206, those skilled in the art will recognize that the carousel 1200 can be implemented using different structures.

Figure 15:
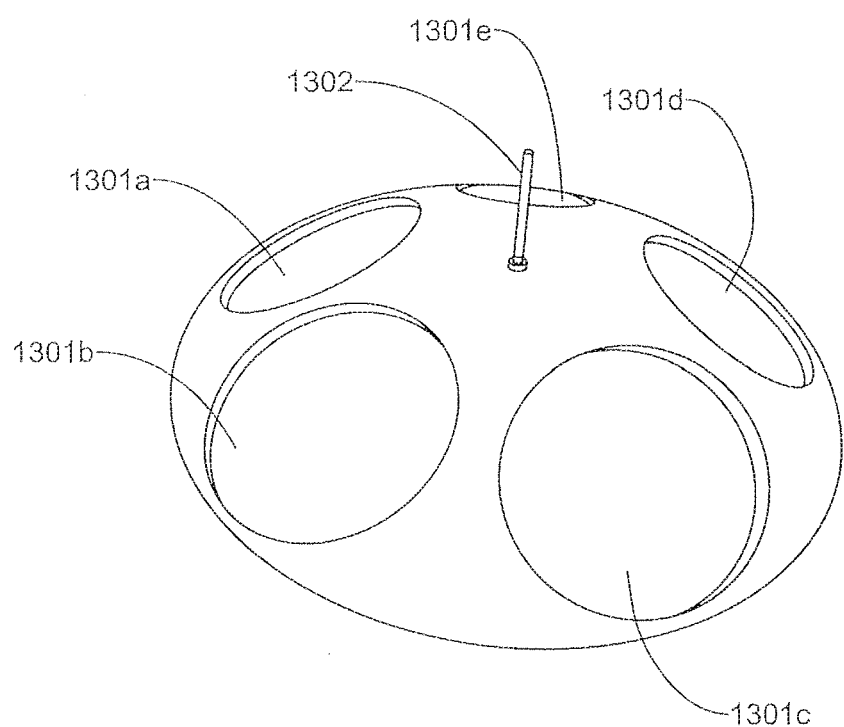
FIG. 15 depicts an example dome wafer transport system suitable for use in certain embodiments.

FIG. 15 depicts a dome wafer transport system 1300. Rather than supporting the wafers 1201a-c along a periphery of a carousel, the dome wafer system 1300 instead provides a plurality of wafer supports 1301a-e disposed about a surface of the dome wafer system 1300. Each of the wafer supports 1301a-e is configured to receive a wafer at an angle appropriate for substantially even deposition of the coating material on or in the wafer. Like the carousel 1200, the dome wafer system 1300 can be rotated by a central shaft 1302. In some embodiments, a motorized conveyor along the rim 1065 can be used to rotate the dome or carousel instead of the central shaft 1302.

Figure 16:
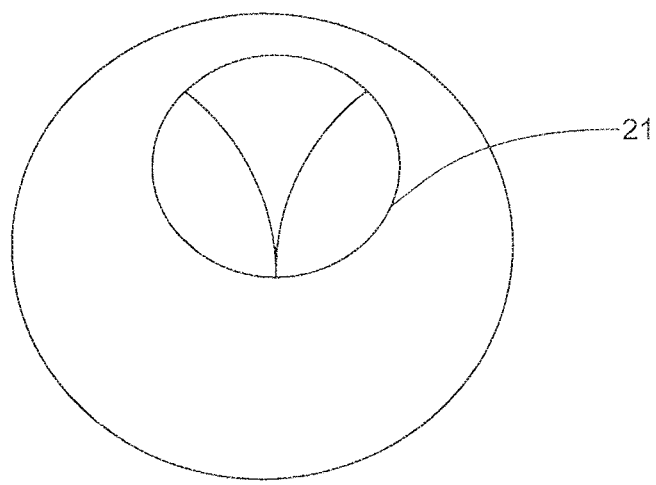
FIG. 16 depicts an example configuration of a top down perspective of a mask that can be used on the apparatus in FIG. 2.

FIG. 16 is a top down perspective of FIG. 2 of a mask that can be used on the apparatus of FIG. 2, and illustrates a mask over the offset bore 21 to optimize the uniformity while coating wafers passing over bore 21, by blocking some of the coating material. Mask shapes can vary with wafer size and chamber configuration. Masks can be used on all Tapered Load-lock Chambers.

Figure 17:
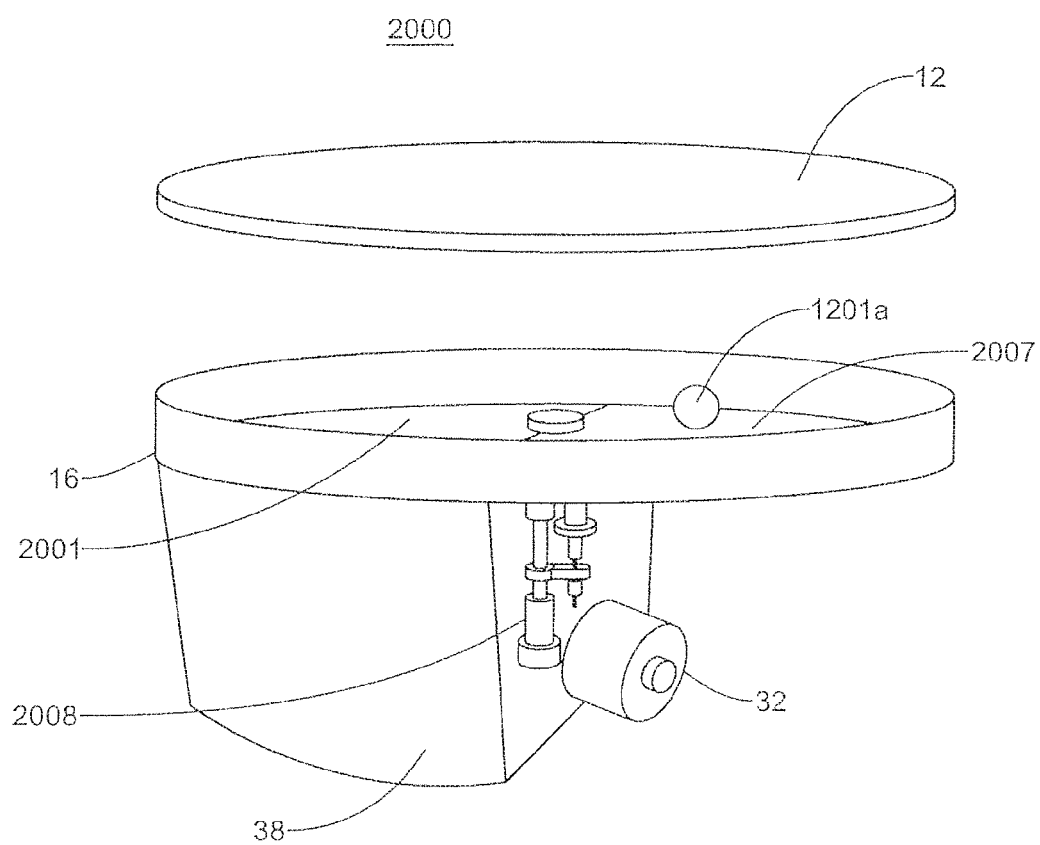
FIG. 17 depicts a side view of the deposition chamber having a rotating valve in a closed position according to exemplary embodiments of the present disclosure.

FIG. 17 depicts a perspective view of the deposition chamber in an embodiment of a PVD apparatus 2000 having a rotating half disc valve 2001 in a closed position. FIG. 19D depicts a downward view of the apparatus 2000. FIG. 20D depicts a side view of the apparatus 2000. While the valve 2001 may rotate, the remainder of the floor 2007 can be stationary.

Figure 18:
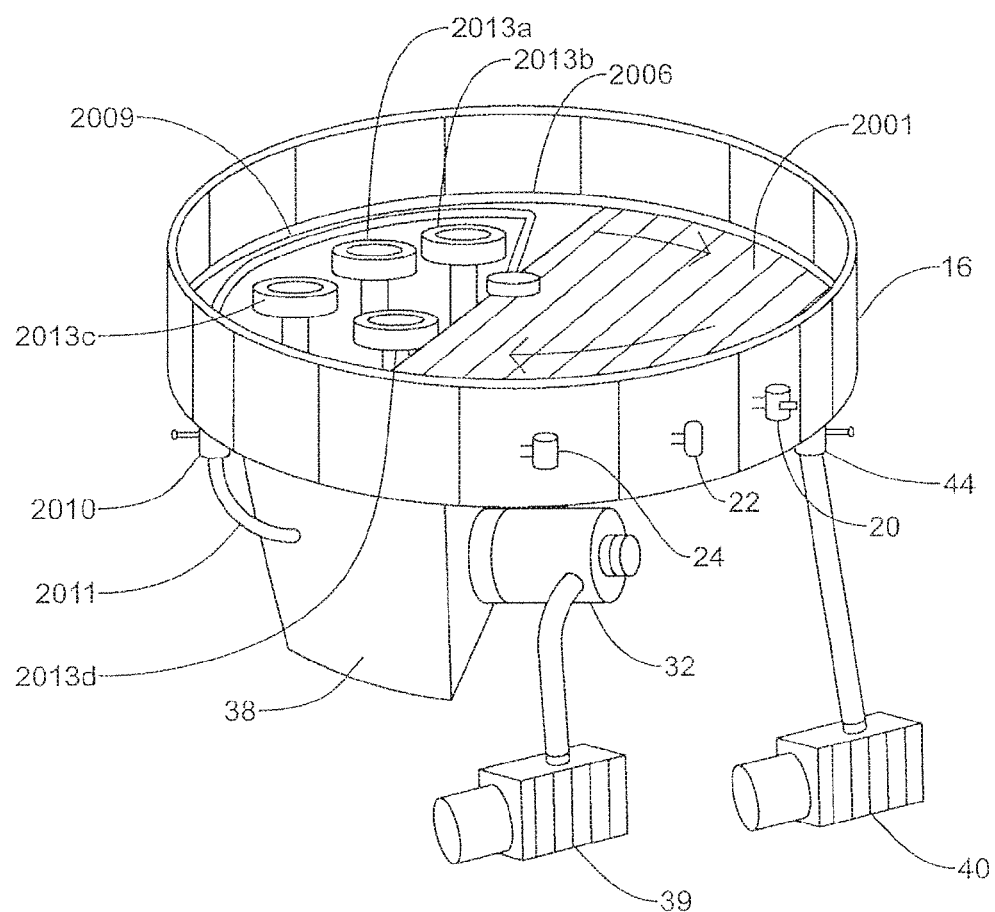
FIG. 18 depicts a perspective view of the deposition chamber having a rotating valve in a partially open position according to exemplary embodiments of the present disclosure.

FIG. 18 depicts the open valve 2001 of FIG. 17 rotating clockwise (as perceived from a downward view of the chamber) moving towards a closed position. This rotation can isolate load-lock deposition chamber 16 from the source chamber 38. The valve 2001 can be a half disc lid that is raised, rotated and lowered by a motorized vacuum rotary feedthrough 2008 with linear movement, shown in FIG. 17 (e.g., Huntington LR 2250 series). The half disk lid can also be configured to move rotationally to isolate the deposition chamber 16 from the source chamber 38. The feedthrough can be mounted on the bottom of the load-lock deposition chamber 16. Alternatively, the lid can be moved up and down as it rotates, and can use grooves and springs similar to those used in standard gate valves.

The half disc 2001 can be slightly smaller than the inside of the load-lock deposition chamber 16 but can be large enough to cover the entire semicircle o-ring 2009 embedded in the floor rim 2006. An advantage of the half disc valve design can be to provide exposure to multiple evaporation sources such as sputter guns 2013a, 2013b, 2013c and 2013d. Sputter guns can perform best while depositing approximately 7 inches or less from the wafers being coated. Other sources can also operate at this close distance.

To reduce cost and overall size, the half disc valve can also be used in place of the gate valve 18 as shown in apparatus 900 of FIG. 9. The half disc valve can expose half of the wafers in the load-lock deposition chamber 916 to coating material from the source chamber 38 simultaneously. A smaller disc valve, for example, as shown in FIG. 23, can also be used in the load lock deposition chambers of apparatuses 10, 50, and 2200 to replace the gate valves to reduce overall cost and size. A small pipe 2011 can connect the otherwise isolated load lock deposition chamber 16 to the source chamber 38 when a small in-line valve 2010 is opened. Equalizing the pressure can eliminate the need for heavy duty motors to break the seal of the half disc valve 2001 (while closed) when there is a pressure difference from the high vacuum in the source chamber 38 and the rough vacuum of the load lock deposition chamber 16. This device can be added to various Tapered Load-lock chambers described herein.

The deposition apparatus 2000 can operate with all accessories including a wafer carousel or a planetary dome as well as vacuum gauges, cryopump with gate valve, or a turbo pump. An exemplary simplified vacuum sequence can be as follows:

1. With all valves closed, all pumps on, and the source chamber 38 at about 1×10-6 torr or lower: Load product to be coated in the load-lock deposition chamber 16 and close the lid.
2. Open the rough valve 44 and pump the load-lock deposition chamber 16 to about 100 millitorr.
3. Close rough valve 44 and open valve 2010 to equalize vacuum level between chamber 16 and chamber 38.
4. Raise and turn valve 2001 with motorized vacuum rotary feedthrough 2008 to the open position.
5. Wait for the vacuum level in the load-lock deposition chamber 16 to drop below about 1×10−6 Torr and begin coating.

As described herein, FIGS. 19A-D and 20A-D depict exemplary embodiments of Tapered Load-lock Chamber apparatuses having various valve configurations. Although only a single wafer 1201a is depicted in FIGS. 19A-D and 20A-D for purposes of illustration, one skilled in the art will recognize that one or more wafers can be disposed within the deposition chamber, for example, on a rotating carousel, dome, etc., which may be present in exemplary embodiments of the PVD apparatus described herein.

Figure 21:
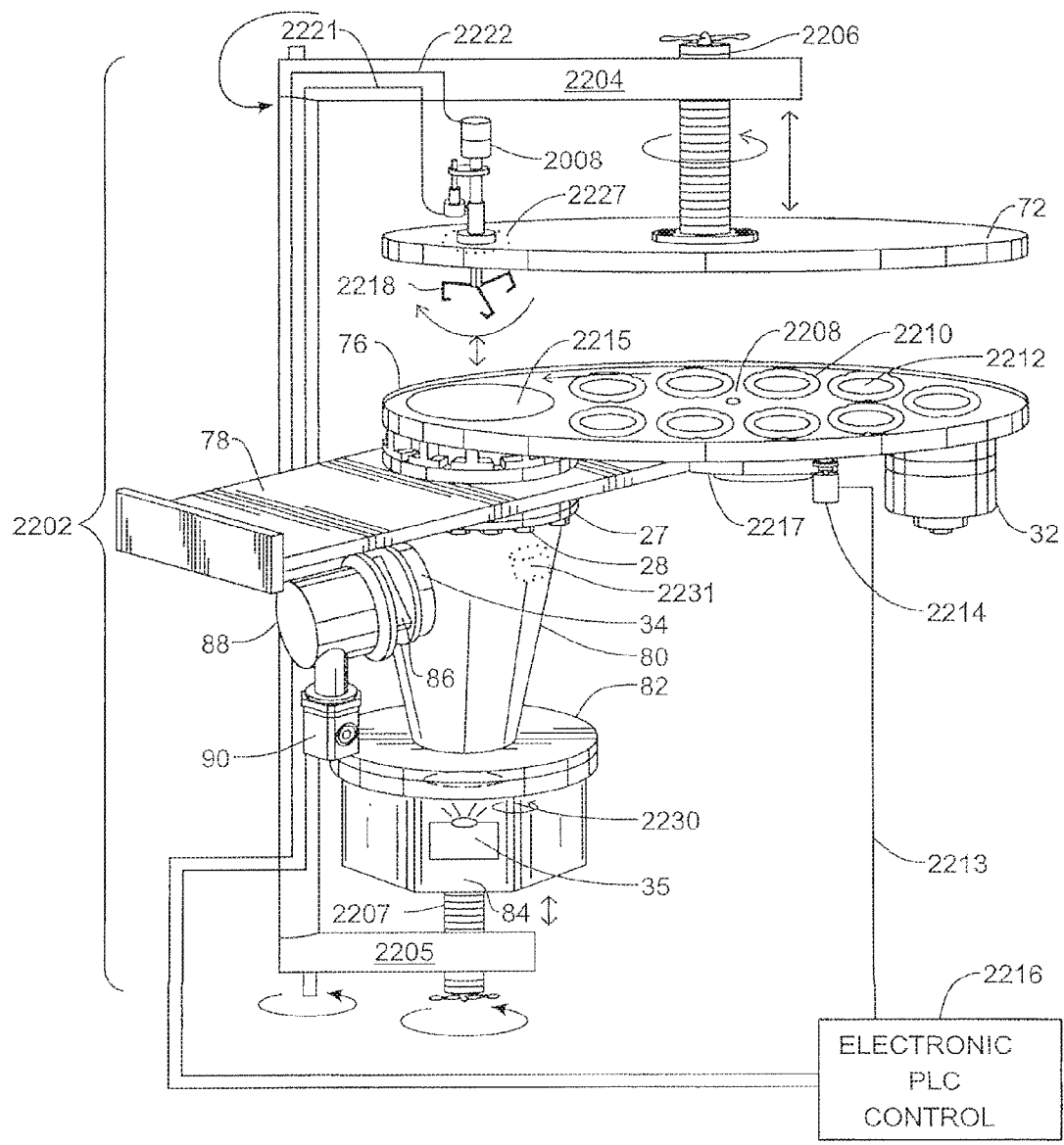
FIG. 21 is a diagrammatic view of another embodiment of an operational physical vapor deposition apparatus having a tapered high vacuum chamber in accordance with the present disclosure, for holding and coating one wafer at a time while spinning on its' own axis.

FIG. 21 is a diagrammatic view of an exemplary embodiment of a physical vapor deposition apparatus 2200. FIG. 19A depicts a downward view of an apparatus similar to the apparatus 2200. FIG. 20A depicts a side view of an apparatus similar to the apparatus 2200. As shown in FIG. 21, the physical vapor deposition (PVD) apparatus 2200 can include similar components as the various embodiments described herein, and can have a substantially similar operation as the various embodiments of apparatuses 10 (FIG. 2), 50 (FIG. 6) and 70 (FIG. 7). The load-lock deposition chamber 76 shown in FIG. 21 can be shallower than the load-lock deposition chambers of FIGS. 2 and 7, and the wafer disc 2208 can be fixed when the shutter 2230 is open, so each wafer can be held and spun on its own axis individually.

For example, the apparatus 2200 can include the lid 72, the deposition chamber 76, the high vacuum chamber 80, and the source chamber 84. The lid 72 can be suspended by a large vertical c-clamp assembly 2202 having support bars 2204 and 2205. A threaded rod 2206 can operatively couple the lid 12 to the assembly 2202. The threaded rod 2206 can be manually rotated to raise or lower the lid 72 with respect to the lower portion of the deposition chamber 76 to open and close the deposition chamber 76. Support bar 2204 can also pivot on c clamp 2202 to allow full access to the chamber 76. This movement can also be made using pneumatic pistons for automatic operation.

A second threaded rod 2207 can be manually rotated to raise or lower the source chamber 84 to allow loading material in the deposition source 35. Support bar 2205 can pivot to allow full access to the source chamber 84. This design can be used on some or all of apparatuses 10, 50, 70, 900, 1000 and 2200. The movement can also be made using pneumatic pistons for automatic operation.

The load-lock deposition chamber 76 can include a rotatable, removable wafer carousel 2208 having one or more wafer holders 2210 for supporting wafers 2212. The wafer carousel 2208 can be rotatable about its center axis to rotate a position of the wafer holders 2210 and vertical align one of the wafer holders 2210 with the high vacuum chamber 80 so that a material can be disposed by the source 35 beneath, on the wafer 2212 held by the holder 2210.

A load-lock valve 78 can be disposed between the deposition chamber 76 and the top of the high vacuum chamber 80 to selectively expose the deposition chamber to the high vacuum chamber 80. FIG. 21 shows the valve in the open position so that the wafer 2210 vertically aligned with the high vacuum chamber 26 can be exposed to deposition material.

An indexing motor 2214 can be operatively coupled to the ring 2208 via a rotational vacuum fed through 2217. The motor 2214 can be driven by the controller 2216 with line 2213 to rotate the feed through 2217 to rotate the carousel 2208 and position the holders 2210 with respect to the high vacuum chamber 26. For example, an electronic PLC controller 2216 can be operatively coupled to the motor 2214 by a control line 2216 and can be configured to drive the motor to move the wafer holders to indexed positions within the deposition chamber 76.

Figure 22:
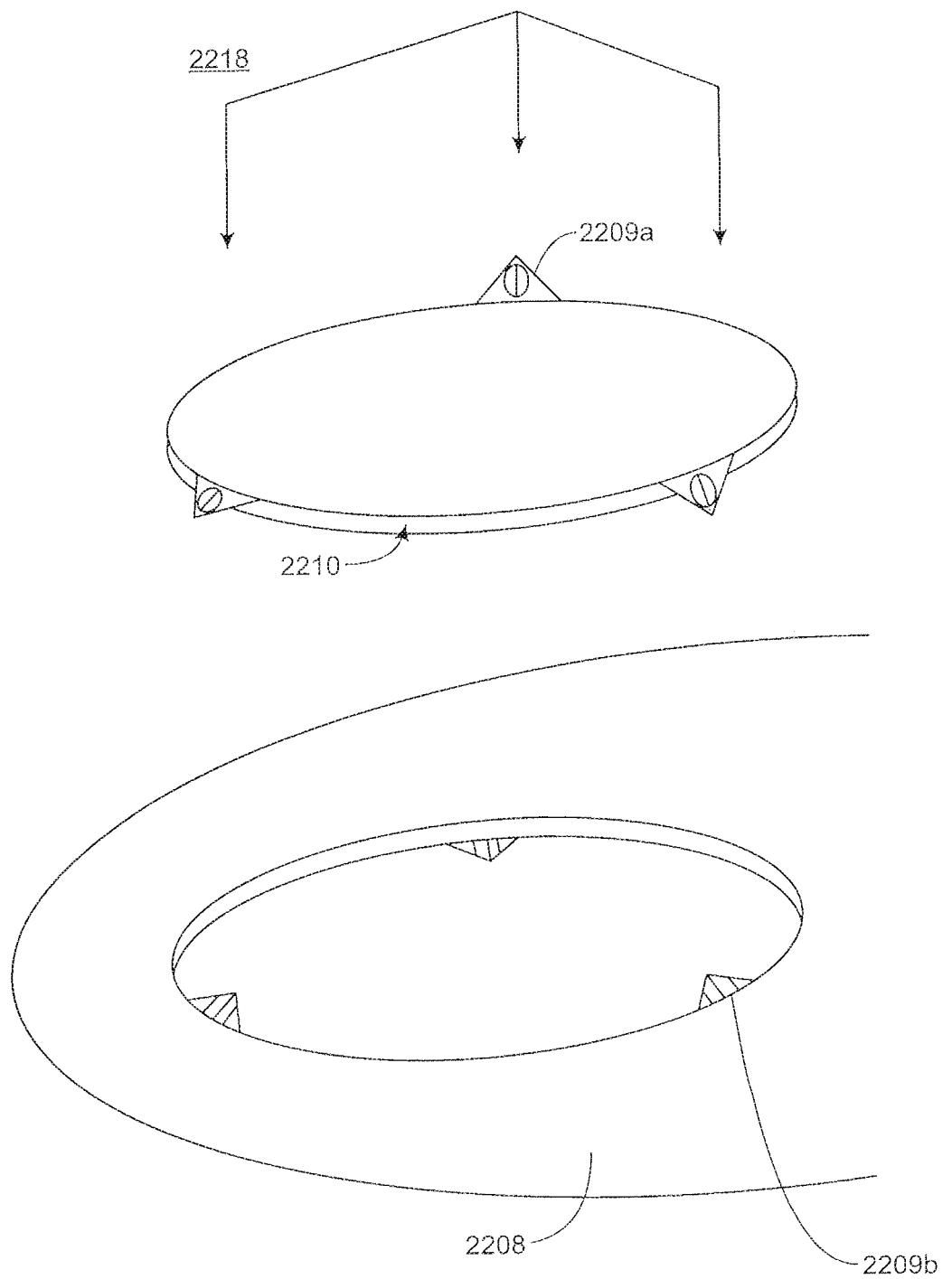
FIG. 22 is a close-up view of exemplary wafer holders of FIG. 21.

As shown in FIGS. 21 and 22, each of the holders 2210 can be individually rotatable about their center axis to spin the wafers 2212 about their center axes. For example, when a wafer ring 2210, resting in the wafer carousel 2208, is vertically aligned with the high vacuum chamber 80, a PLC controller 2216 can be used to move both motors in a motorized vacuum rotary feedthrough 2008 with control lines 2221 and 2222. Feedthrough 2008, mounted through the lid 72, can lower with attached forks 2218, and rotate to insert through hangers 2209a in the wafer ring 2210, resting in the wafer carousel 2208. The feedthrough 2008 can raise the ring off of the carousel into bore 2227. The ring is then rotated slightly and lowered between tabs 2209b of the carousel. Lowering the ring close to or into the bore 2215 where deposition material is traveling upward, can minimize unintended coatings on other wafers, while the ring is spun by the feedthrough 2008. The exemplary process can provide optimal deposition uniformity and minimum particle generation (with no moving parts exposed to deposition making contact). The process of individually picking up and spinning wafers to be coated can be used on some or all of apparatuses 10, 50, 70, 900, 1000, 2000 and 2200. Multiple stations for picking up and spinning wafers can also be used for increased throughput.

An exemplary coating sequence with 1 station is described below:

1. Place the carousel 2208, loaded with wafers 2212 in rings 2210 in the load-locked deposition chamber 76.
2. Close the lid 72 and perform the pump down sequence (similar to embodiments described herein)
3. Turn on the source 35 with the shutter 2230 closed.
4. Rotate the carousel 2208 until a wafer 2212 is centered over the bore 2215.
5. Lower the forks 2218 using feedthrough 2008 (controlled by PLC 2216 through lines 2221 and 2222) to a set length.
6. Rotate forks 2218 to a set angle and raise the wafer ring 2210 by the hooks 2209a, 2209b and 2209c into bore 2227.
7. Rotate the ring 2210 to a set angle and lower the ring between tabs 2209a, 2209b and 2209c into bore 2215.
8. Spin wafer ring 2210 continuously.
9. Open shutter 2230 and coat until desired thickness is achieved by timer or thickness monitor
10. Stop fork 2218 rotation at specific angle and raise wafer ring 2210. After rotating to proper angle, lower on to tabs 2209.
11. Rotate forks out of hooks and raise forks. Rotate carousel 2208 to coat next wafer.

FIG. 23 depicts an alternative gate valve design that employs a vacuum feedthrough 2232 with linear and rotational movement attached to a disc 2233 to selectively isolate the load-lock deposition chamber 76 from the high vacuum chamber below with an O-ring seal, with the O-ring embedded in the disc or around bore 2215 in the floor of the load-lock deposition chamber 76. This design will reduce pump down time and volume of the apparatus. Except as described above, FIG. 23 includes the same or similar components described with reference to FIGS. 21 and 22 as illustrated by the reference numbers included in FIG. 23.

Multiple carousels can be stacked in the load-locked deposition chamber when one wafer ring bore in each carousel is left vacant. The vacant bore facilitates the forks to reach through for wafers in rings on other carousels to be selected and coated with deposition material by rotating additional carousels with separate simple drive mechanisms.

An Ion source 2231 can be mounted below the load-lock valve 78 to improve adhesion of the coatings with etch modes prior to depositions, or during depositions using ion assist methods. Source 2231 can be mounted on an angle, and out of the deposition path between the source 35 and the wafers being coated on wafer carriers 2212.

Referring to FIG. 21, shown is a rotatable vertical shaft mounted through the base of the source chamber, with a metal fin that is large enough to completely block the source (known as a shutter) can selectively expose parts to deposition as desired.

Shielded valves can replace standard gate valves used as load lock valves on all described examples that can use standard gate valves. One example of shielded valves are shielded valves manufactured by GNB Corporation, which can be manufactured in various sizes, and can be found on their website www.gnbvalves.com. Meizner traps and other cooling systems can also be used to achieve lower ultimate vacuum levels in all described examples.

FIG. 24 illustrates an exemplary flow chart for individually coating substantially all of a wafer. For example, exemplary embodiments of the present disclosure can be configured to completely and sequentially coat wafers one at a time such that each wafer is aligned with the vacuum chamber to receive the source material. By coating a single wafer at a time, exemplary embodiments of the present disclosure can achieve an increased coating uniformity as compared to embodiments in which multiple wafers are coated simultaneously. Additionally, the single wafer can be spun on its own axis, which can provide high uniformity coatings with low particle generation.

Figure 24A:
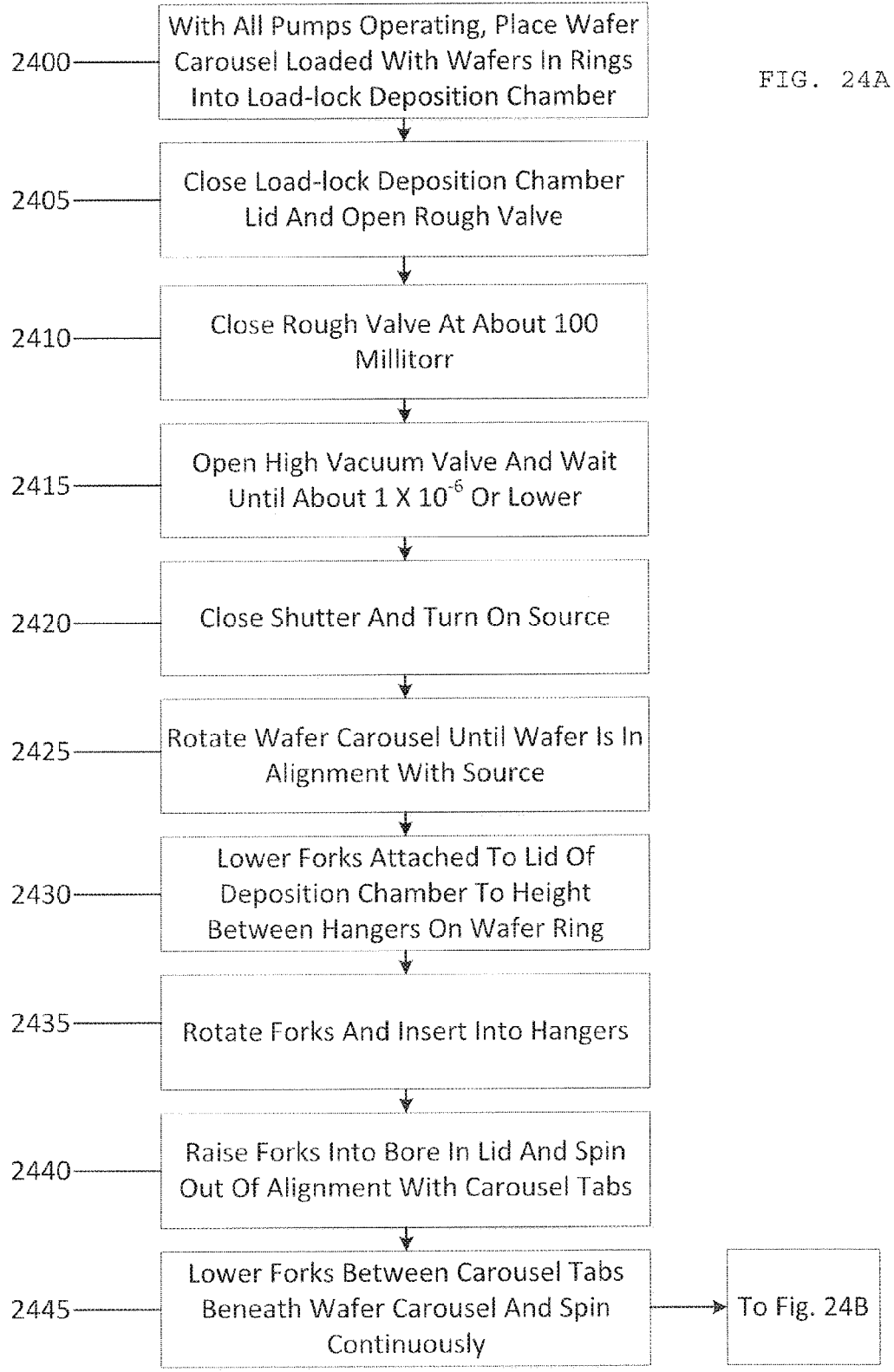
FIGS. 24A and 24B are flow charts illustrating methods for substantially coating all of a wafer according to an exemplary embodiment of the present disclosure.
Figure 24B:
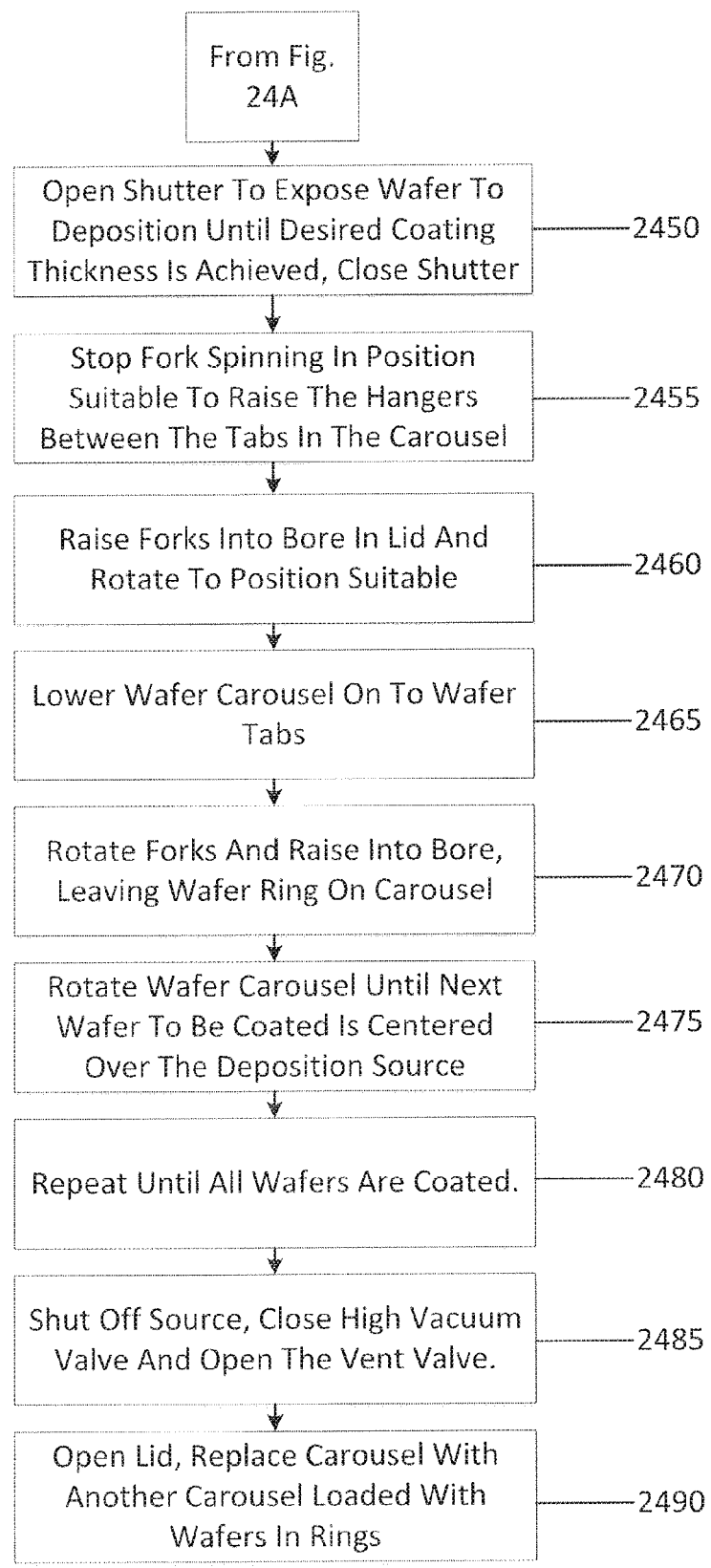

FIGS. 24a and 24b illustrate a further exemplary flow chart for substantially coating all of a wafer. At step 2400, with some or all of pumps operating, the wafer carousel (e.g., loaded with wafers resting in wafer rings) can be placed in to the load-locked deposition chamber. The load-lock deposition chamber lid can be closed and the rough valve can be opened at step 2405. At step 2410, the rough valve is closed when about 100 millitorr is achieved, and the high vacuum valve can be opened at step 2415 until about 1×10–6 Torr or lower is achieved. At step 2420, the source can be turned on with the shutter closed, and the wafer carousel can be rotated until a wafer is in alignment with the source beneath at step 2425. At step 2430, forks attached to the lid of deposition chamber can be lowered to height between hangers on the wafer ring. The forks can be rotated and inserted into the hangers at step 2435, and raised into a bore in the lid and spun out of alignment with the carousel tabs at step 2440. The forks can then be lowered, between carousel tabs, beneath the wafer carousel and spun continuously at step 2445.

Continuing with FIG. 24b, the shutter can be opened at step 2450 to expose the wafer to the deposition until the desired coating thickness is achieved, and then then the shutter can be closed. At step 2455, the fork can stop spinning in position suitable to raise the hangers between the tabs in the carousel. The forks are then raised into the bore in the lid at step 2460, rotated to a suitable position, and then the wafer ring is lowered on to the carousel tabs at step 2465. At step 2470, the forks are rotated and raised into the bore, leaving the wafer ring on the carousel. At step 2475, the wafer carousel can be rotated until another wafer to be coated is centered over the deposition source. The above procedure can be repeated at step 2480 until all wafers are coated. At step 2485, the source can be shut off, the high vacuum valve can be closed, and the vent valve can be opened. At step 2490, the lid can be opened, and the carousel can be replaced with another carousel loaded with wafers in rings.

While exemplary embodiments describe opening and closing the valve for each wafer to be coated, those skilled in the art will recognize that the valve between can remain open for multiple wafers and each wafer can be completely and sequentially coated. For example, to prevent undesirable or unintentional coating of wafers during rotation between wafers, the shutter between the source and the vacuum chamber can be controlled to selectively close until a wafer to be coated is aligned with the vacuum chamber.

It will be apparent that many modifications can be made to the disclosed apparatus and method without departing from exemplary embodiments of the present disclosure. The dimensions provided are representative of the embodiments described, and one of ordinary skill in the art will recognize that such dimensions may be varied depending on the PVD apparatus requirements for different applications. Therefore, it is the intent of the appended claims to cover all such variations and modifications as come within the true spirit and scope of this invention.

What is claimed is:

1. An electron beam physical vapor deposition apparatus comprising:

a vacuum chamber extending along a longitudinal axis from a first end to a second end, the vacuum chamber tapering inwardly along the longitudinal axis from the first end to the second end, the second end have a cross-sectional area less than the first end;

a deposition chamber including a bore and an interior receiving area configured to receive one or more components to be coated, the bore aligned with and disposed proximate to the first end of the vacuum chamber;

a valve disposed between the interior area of the deposition chamber and the first end of the vacuum chamber to selectively separate the interior receiving area of the deposition chamber from the vacuum chamber;

a rotatable wafer carousel disposed in the deposition chamber having a plurality of wafer holders circumferentially disposed therein to hold one or more wafers parallel to the bore, the rotatable wafer carousel rotatable about a central axis in indexed increments to align each of the one or more wafers in a stationary position above the bore;

a motorized vacuum rotary feedthrough disposed in the deposition chamber in vertical alignment with the bore, the motorized vacuum rotary feedthrough includes a plurality of forks configured to releasably connect to one of the plurality of wafer holders to lift the one of the plurality of wafer holders from the wafer carousel, rotationally offset the lifted wafer holder, lower the lifted wafer holder through the wafer carousel into the bore, and rotate the lifted wafer holder in the bore during vapor deposition; and a source chamber housing an evaporation source disposed proximate to the second end of the vacuum chamber and vertically aligned with the bore.

2. The apparatus of claim 1, wherein the vacuum chamber comprises a tapered rectangular shaped chamber.

3. The apparatus of claim 1, wherein the vacuum chamber comprises a tapered cone shaped chamber.

4. The apparatus of claim 3, wherein the tapered cone shaped chamber is a tapered truncated cone shaped chamber.

5. The apparatus of claim 1, wherein a cross-sectional area of the vacuum chamber decreases along the longitudinal axis from the first end to the second end.

6. The apparatus of claim 1, wherein the vacuum chamber comprises a first flange disposed with respect to the first end and a second flange disposed with respect to the second end, the first flange providing a surface for coupling the vacuum chamber to the deposition chamber and the second flange providing a surface for coupling the vacuum chamber to the source chamber.

7. The apparatus of claim 1, wherein the wafer carousel includes a plurality of carousel tabs and the motorized vacuum rotary feedthrough rotates the one of the plurality of wafer holders with the plurality of forks connected thereto out of alignment with the plurality of carousel tabs to allow lowering of the one of the plurality of wafer holders past the plurality of carousel tabs.

8. The apparatus of claim 7, wherein the one of the plurality of wafer holders includes a plurality of hangers extending outwardly from an outer perimeter thereof and the plurality of forks connect thereto.

* * * * *